(12) United States Patent
Iwadate

(10) Patent No.: US 9,581,672 B2
(45) Date of Patent: Feb. 28, 2017

(54) MAGNETIC RESONANCE APPARATUS AND METHOD FOR ACQUIRING NAVIGATOR SIGNALS

(71) Applicant: GE MEDICAL SYSTEMS GLOBAL TECHNOLOGY COMPANY, LLC, Waukesha, WI (US)

(72) Inventor: Yuji Iwadate, Tokyo (JP)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 521 days.

(21) Appl. No.: 14/283,674

(22) Filed: May 21, 2014

(65) Prior Publication Data

US 2014/0354280 A1   Dec. 4, 2014

(30) Foreign Application Priority Data

May 31, 2013 (JP) ................. 2013-115657

(51) Int. Cl.
*G01R 33/56* (2006.01)
*G01R 33/567* (2006.01)
*G01R 33/3415* (2006.01)

(52) U.S. Cl.
CPC ...... *G01R 33/5676* (2013.01); *G01R 33/3415* (2013.01)

(58) Field of Classification Search
CPC .......... G01R 33/5676; G01R 33/56509; G01R 33/3415; G01R 33/543; G01R 33/243; G01R 33/36; G01R 33/4616; G01R 33/4835; G01R 33/5611; G01R 33/5616; G01R 33/56325; G01R 33/56563; G01R 33/5673;

(Continued)

(56) References Cited

U.S. PATENT DOCUMENTS 8,264,223 B2   9/2012 Iwadate et al.
8,624,596 B2   1/2014 Kannengisser et al.
(Continued)

FOREIGN PATENT DOCUMENTS

| CN | 101843484 A | 9/2010 |
|---|---|---|
| CN | 103068313 A | 4/2013 |
| JP | 2011193884 A | 10/2011 |

OTHER PUBLICATIONS

CN OA for Application No. 201410237219.3. Office Action dated Dec. 10, 2015.

(Continued)

*Primary Examiner* — Clayton E Laballe
*Assistant Examiner* — Ruifeng Pu

(57) ABSTRACT

A magnetic resonance apparatus which acquires navigator signals generated from a navigator region including a first portion and a second portion, the navigator signals acquired using a coil having a plurality of channels, is provided. The magnetic resonance apparatus includes a scan unit configured to execute a first navigator sequence for acquiring first navigator signals generated from the navigator region, a profile generating unit configured to generate first profiles each including position information on the first portion for every channel, a determining unit configured to determine correlations between the first profiles and a template, and a selecting unit configured to select each channel used to acquire the position information on the first portion based on the correlations.

20 Claims, 24 Drawing Sheets

(58) Field of Classification Search
CPC .............. G01R 33/58; G06T 7/0012; G06T 2207/10072; G06T 2207/10081; G06T 2207/10108; G06T 2207/30056; G06T 2207/30061; G06T 2207/30101; A61B 6/032; A61B 6/037; A61B 6/461; A61B 6/469; A61B 6/507; A61B 6/5217
See application file for complete search history.

(56) References Cited

U.S. PATENT DOCUMENTS

| | | | |
|---|---|---|---|
| 2003/0002723 A1 | 1/2003 | Li et al. | |
| 2008/0211497 A1* | 9/2008 | Iwadate | G01R 33/5676 324/307 |
| 2010/0171497 A1 | 7/2010 | Iwadate et al. | |
| 2011/0074411 A1* | 3/2011 | Tomoda | G01R 33/5676 324/307 |
| 2011/0080167 A1* | 4/2011 | Kannengisser | G01R 33/56509 324/309 |
| 2012/0082355 A1* | 4/2012 | Mendes | G01R 33/56509 382/131 |
| 2012/0245453 A1* | 9/2012 | Tryggestad | A61B 6/463 600/413 |
| 2013/0144160 A1 | 6/2013 | Sakuragi | |
| 2013/0187650 A1 | 7/2013 | Pfeuffer et al. | |
| 2013/0278263 A1 | 10/2013 | Huang et al. | |
| 2014/0296702 A1* | 10/2014 | Griswold | G01R 33/3614 600/416 |
| 2015/0182117 A1* | 7/2015 | Senegas | A61B 5/055 600/410 |
| 2015/0247911 A1* | 9/2015 | Iwadate | G01R 33/5676 324/309 |
| 2015/0310299 A1* | 10/2015 | Goto | G01R 33/543 382/128 |
| 2016/0038054 A1* | 2/2016 | Benner | A61B 5/055 600/413 |
| 2016/0161585 A1* | 6/2016 | Wadate | G01R 33/3415 600/413 |

OTHER PUBLICATIONS

Brau et al.. "Evaluation of Coil Selection Algorithms for Body Navigators" ISMRM, dated 2012, pp. 1.

* cited by examiner

NAVIGATOR REGION Rnav

FIG. 7
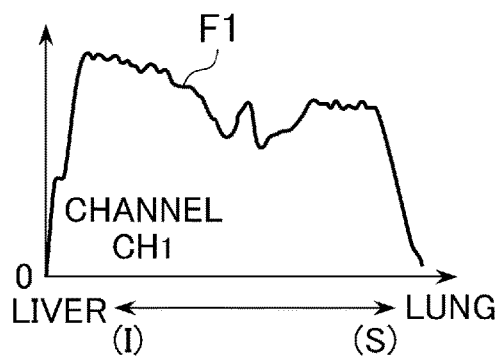
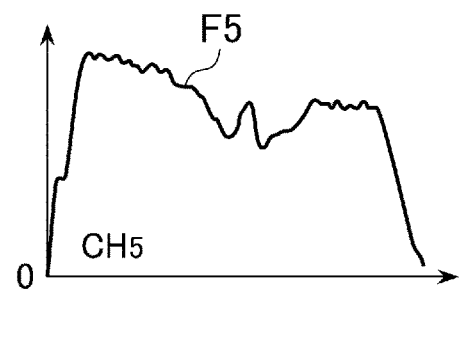
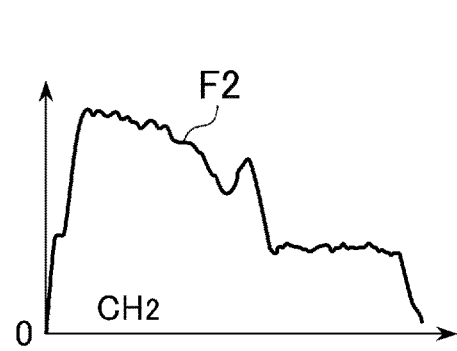
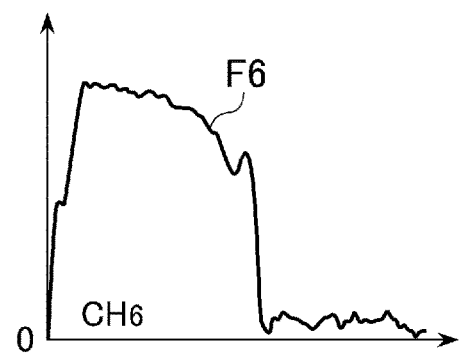
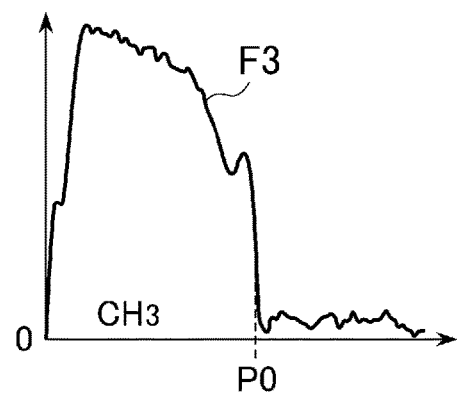
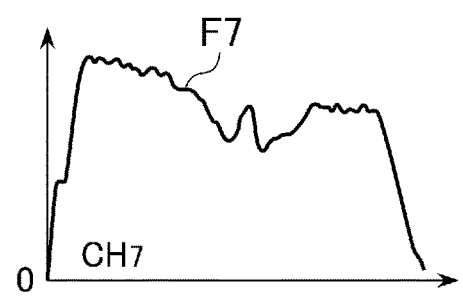
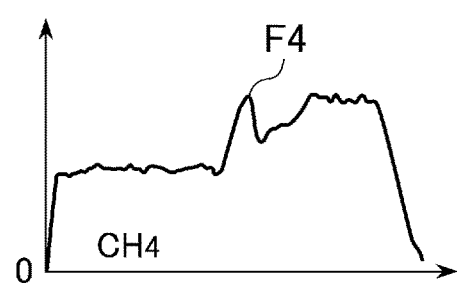
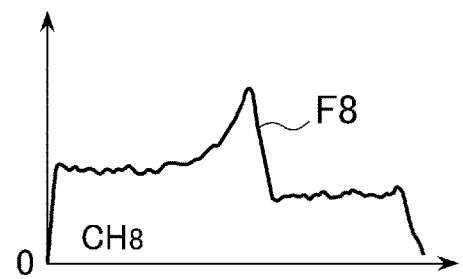

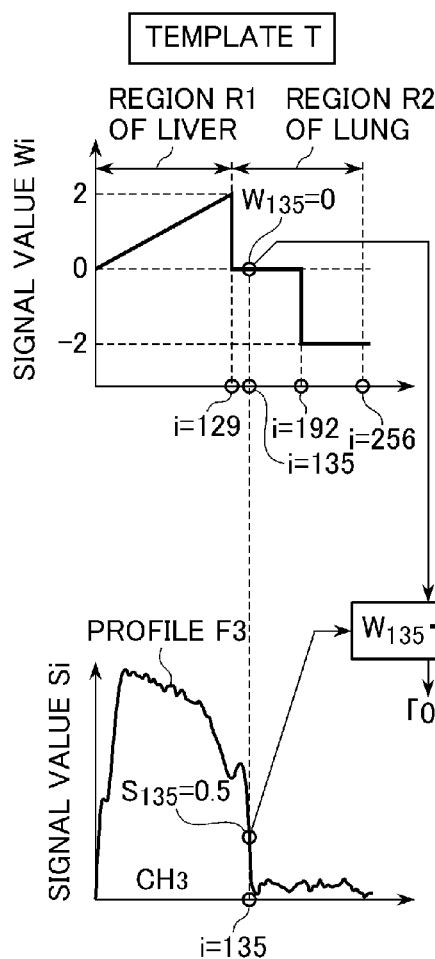
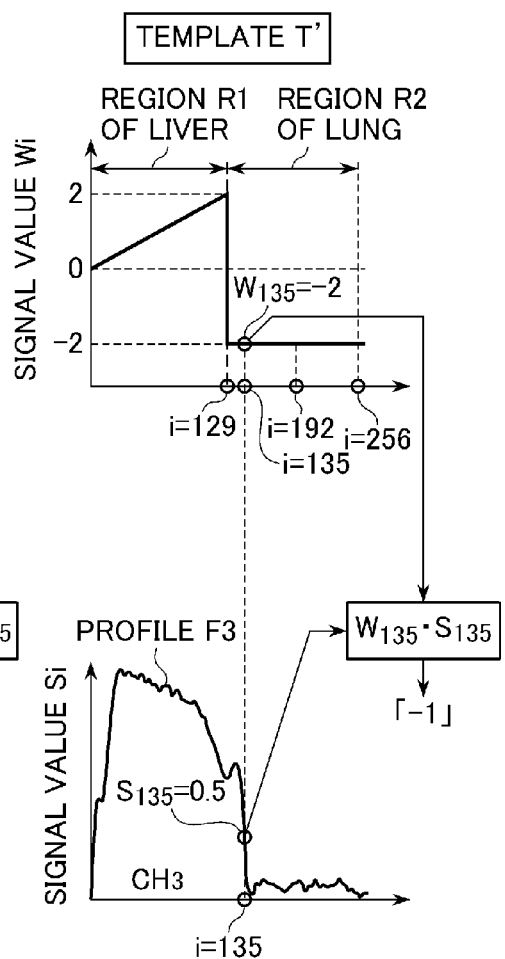

FIG. 25
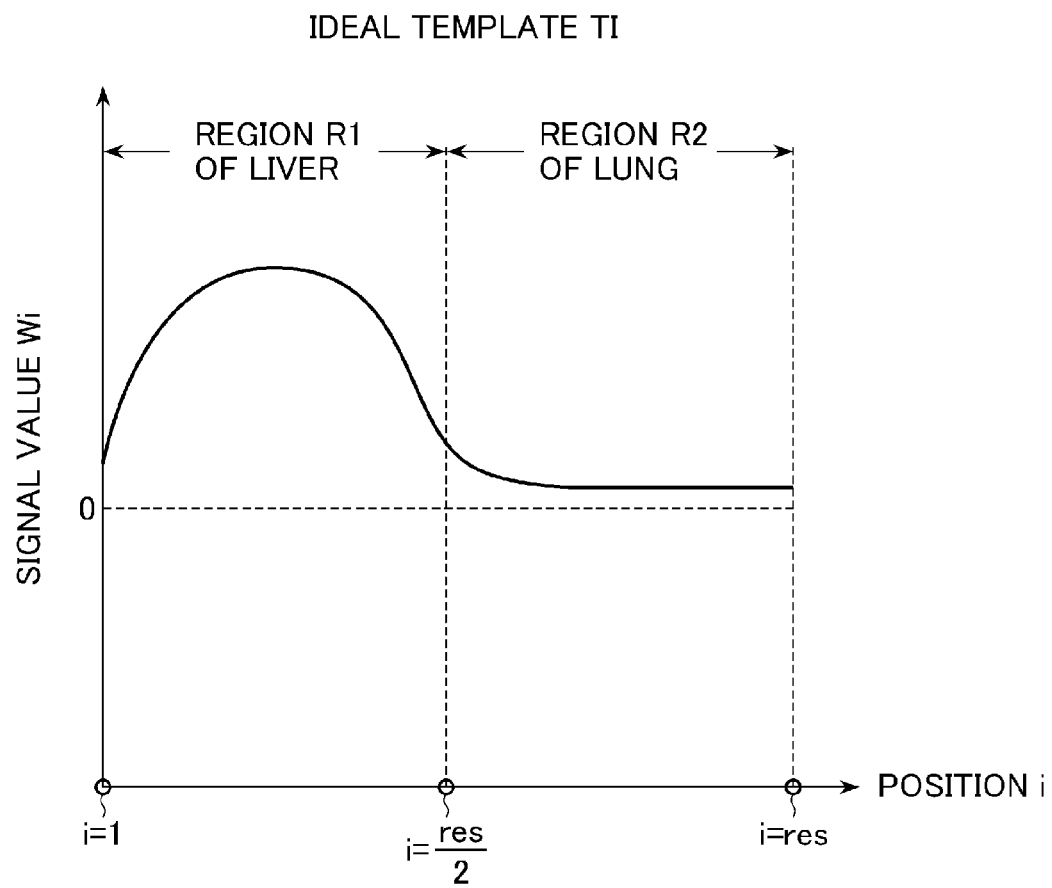
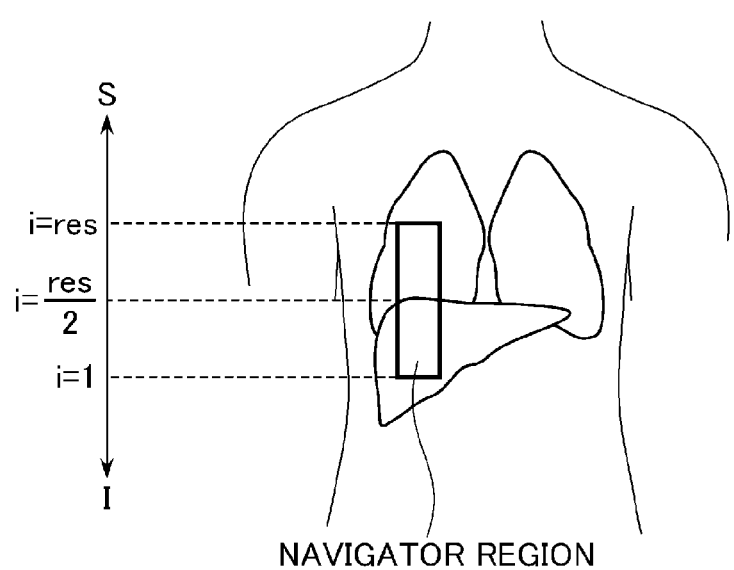

MAGNETIC RESONANCE APPARATUS AND METHOD FOR ACQUIRING NAVIGATOR SIGNALS

CROSS REFERENCE TO RELATED APPLICATIONS

This application claims the benefit of Japanese Patent Application No. 2013-115657 filed May 31, 2013, which is hereby incorporated by reference in its entirety.

BACKGROUND OF THE INVENTION

The present invention relates to a magnetic resonance apparatus which acquires navigator signals generated from a navigator region including body-moving portions, using a coil having a plurality of channels, and a method for acquiring navigator signals generated from the navigator region.

There has been known a body movement correction technology using navigator echoes. The body movement correction technology is effective in reducing artifacts caused by respiration, for example. When, however, the navigator echoes are acquired from the boundary between the liver and the lung, there is a case where body movement information cannot be acquired due to unnecessary signals of subcutaneous fat and the like.

To cope with the foregoing problem, there has been known a technology which acquires navigator echoes using a multicoil having a plurality of channels and selects a channel less susceptible to signals of subcutaneous fat and the like out of the channels (See, for example, Brau et al. "Evaluation of Coil Selection Algorithms for Body Navigators" ISMRM, 2012, 3407).

In Brau et al. "Evaluation of Coil Selection Algorithms for Body Navigators" ISMRM, 2012, 3407, each channel is selected using a template TI shown in FIG. 25. In the template TI, a signal value in an SI direction of a navigator region is a profile having ideal values. In the template TI (hereinafter may be called "ideal template"), the horizontal axis indicates a position i in the SI direction of the navigator region, and the vertical axis indicates a signal value Wi. A resolution in the SI direction of the ideal template TI is expressed in "res". When res=256, for example, the resolution in the SI direction of the ideal template TI becomes 256 pixels. The ideal template TI can be generated by referring to data of plurality of profiles obtained from a plurality of healthy human bodies. In Brau et al. "Evaluation of Coil Selection Algorithms for Body Navigators" ISMRM, 2012, 3407, the ideal template TI shown in FIG. 25 is prepared, correlation coefficients between the ideal template TI and profiles obtained from respective channels are calculated. Then, channels less susceptible to the signals of the subcutaneous fat and the like are selected out of the plural channels, based on the correlation coefficients.

In the method of Brau et al. "Evaluation of Coil Selection Algorithms for Body Navigators" ISMRM, 2012, 3407, however, there is a case where the optimal channels cannot be selected when a signal in a lung region is large. There has therefore been a demand for a technology capable of selecting the optimal channels even when the signal in the lung region is large.

BRIEF DESCRIPTION OF THE INVENTION

In a first aspect, a magnetic resonance apparatus acquiring navigator signals generated from a navigator region including a body-moving first portion and a body-moving second portion using a coil having a plurality of channels is provided. The magnetic resonance apparatus includes a scan unit which executes a first navigator sequence for acquiring first navigator signals generated from the navigator region using the coil, a profile generating unit which generates first profiles each including position information on the first portion for every above channel, based on the first navigator signals received by the channels respectively, a determining unit which determines correlations between the first profiles and the template, based on signal values of the first profiles and a signal value of a template indicative of a profile of reference for the navigator region, and a selecting unit which selects each channel used to acquire the position information on the first portion out of the channels, based on the correlations, wherein the signal value of the template includes a signal value of a first polarity in a region for the first portion, and includes a signal value of a second polarity opposite to the first polarity in a region for the second portion.

In a second aspect, a program which is applied to a magnetic resonance apparatus executing a first navigator sequence for acquiring first navigator signals generated from a navigator region including a body-moving first portion and a body-moving second portion, using a coil having a plurality of channels, is provided. The program causes a computer to execute a profile generating process which generates first profiles each including position information on the first portion for every above channel, based on the first navigator signals received by the channels respectively, a process which determines correlations between the first profiles and the template, based on signal values of the first profiles and a signal value of a template indicative of a profile of reference for the navigator region, and a selecting process which selects the channel used to acquire the position information on the first portion out of the channels, based on the correlations, wherein the signal value of the template includes a signal value of a first polarity in a region for the first portion, and includes a signal value of a second polarity opposite to the first polarity in a region for the second portion.

By using a template including a signal value of a first polarity in a region for a first portion and a signal value of a second polarity opposite to the first polarity in a region for a second portion, each channel less susceptible to unnecessary signals can be selected out of a plurality of channels.

Further advantages will be apparent from the following description of exemplary embodiments as illustrated in the accompanying drawings.

BRIEF DESCRIPTION OF THE DRAWINGS

FIG. 7 is a diagram schematically illustrating profiles F1 through F8 obtained for every CH1, . . . CH8 of channels of the receiving coil 4.

FIGS. 23A and 23B are diagrams for describing the reason why the template T can suitably be used.

FIG. 25 is a diagram schematically showing the template used in Brau et al. "Evaluation of Coil Selection Algorithms for Body Navigators" ISMRM, 2012, 3407.

DETAILED DESCRIPTION OF THE INVENTION

Modes for carrying out the disclosure will hereinafter be described. The disclosure is however not limited to the following modes.

Figure 1:
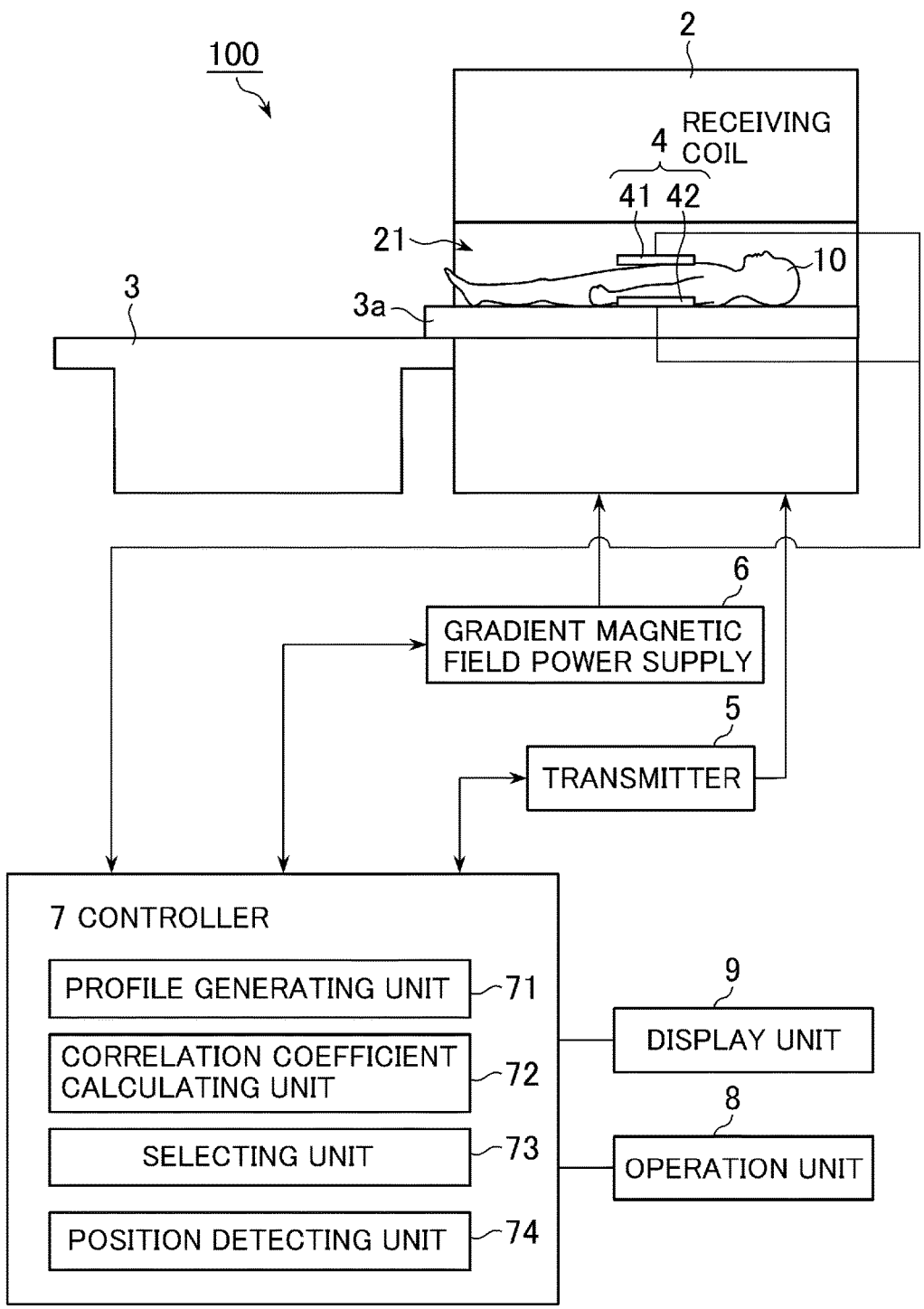
FIG. 1 is a schematic diagram of a magnetic resonance apparatus according to one embodiment.

FIG. 1 is a schematic diagram of a magnetic resonance apparatus according to one embodiment.

The magnetic resonance apparatus (hereinafter called "MR apparatus") 100 has a magnet 2, a table 3, a receiving coil 4, etc.

The magnet 2 has a bore 21 in which a subject 10 is accommodated. A superconductive coil, a gradient coil and an RF coil, etc. have been built in the magnet 2.

The table 3 has a cradle 3a that supports the subject 10. The cradle 3a is configured so as to be capable of moving into the bore 21. The subject 10 is carried in the bore 21 by the cradle 3a.

The receiving coil 4 receives magnetic resonance signals from the subject 10 therein.

Figure 2:
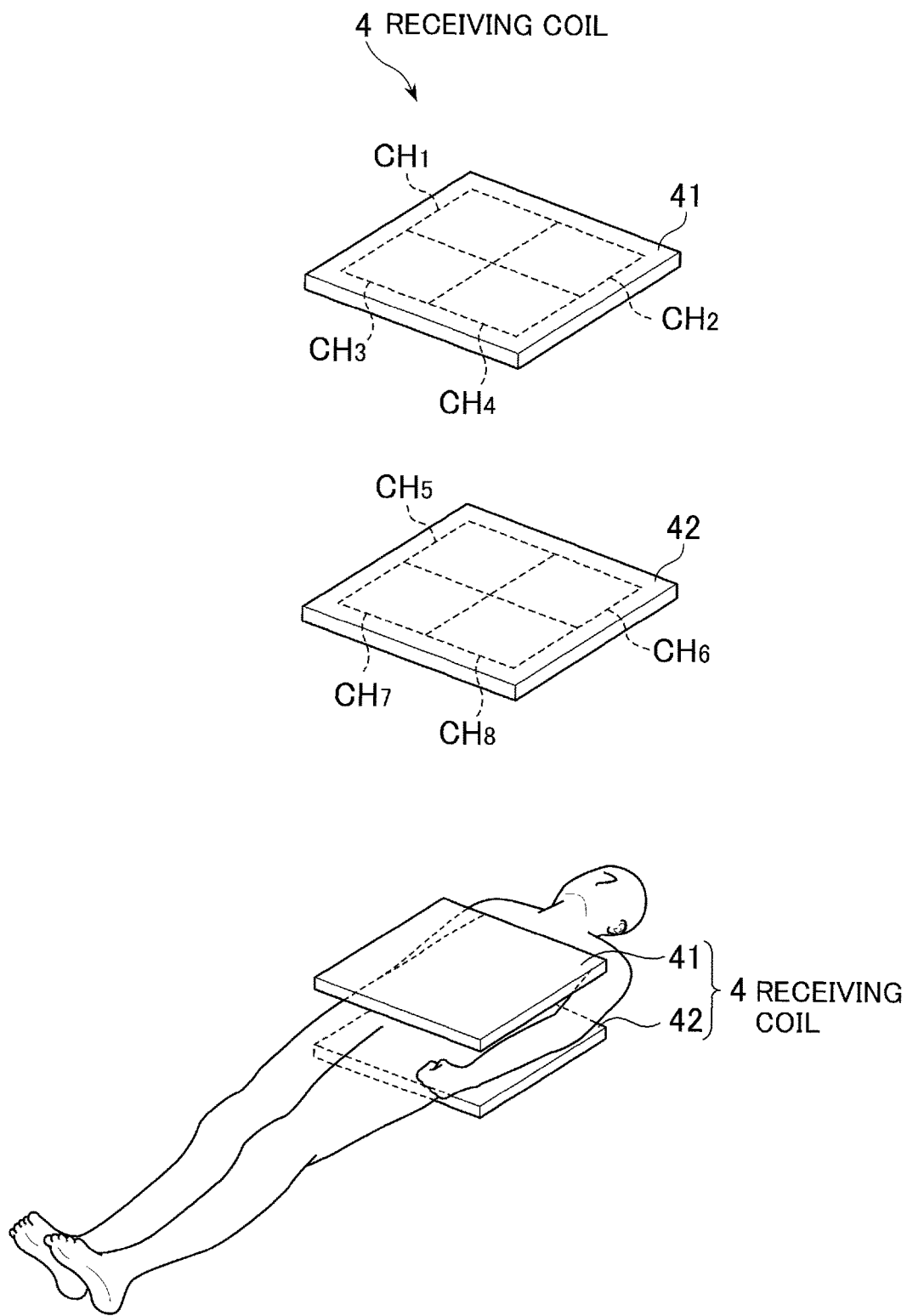
FIG. 2 is an explanatory diagram of a receiving coil 4.

FIG. 2 is an explanatory diagram of the receiving coil 4.

The receiving coil 4 has a first coil part 41 and a second coil part 42. The first coil part 41 has four channels CH1 through CH4 for receiving the magnetic resonance signals from the subject. The second coil part 42 has four channels CH5 through CH8 for receiving the magnetic resonance signals from the subject. Thus, in the exemplary embodiment, the receiving coil 4 is configured as an 8-channel coil. The first coil part 41 is provided on the abdominal side of the subject, and the second coil part 42 is provided on the back side of the subject.

Referring back to FIG. 1, the description of the exemplary embodiment will be continued.

The MR apparatus 100 further includes a transmitter 5, a gradient magnetic field power supply 6, a controller 7, an operation unit 8 and a display unit 9, etc.

The transmitter 5 supplies current to the RF coil. The gradient magnetic field power supply 6 supplies current to the gradient coil.

The controller 7 controls the operations of respective parts of the MR apparatus 100 so as to realize various operations of the MR apparatus 100 such as transmission of information necessary for the display unit 9, reconstruction of an image, based on signals received from the receiving coil 4, etc. The controller 7 has a profile generating unit 71 through a position detecting unit 74 and the like.

The profile generating unit 71 generates profiles including information on the position of an edge of a liver.

The correlation coefficient calculating unit 72 calculates correlation coefficients between a template T (refer to FIG. 11 to be described later) and the profiles generated by the profile generating unit 71.

The selecting unit 73 selects a channel suited for the detection of the position of the edge of the liver out of the eight channels CH1 through CH8 included in the receiving coil 4.

The position detecting unit 74 detects the position of the edge of the liver, based on the profiles.

The controller 7 is one example that configures the profile generating unit 71 through the position detecting unit 74 and functions as these units by executing a predetermined program.

The operation unit 8 is operated by an operator and inputs various information to the controller 7. The display unit 9 displays various information thereon.

The MR apparatus 100 is configured in the above-described manner.

Figure 3:
FIG. 3 is a diagram showing scans executed in a first embodiment.
Figure 4:
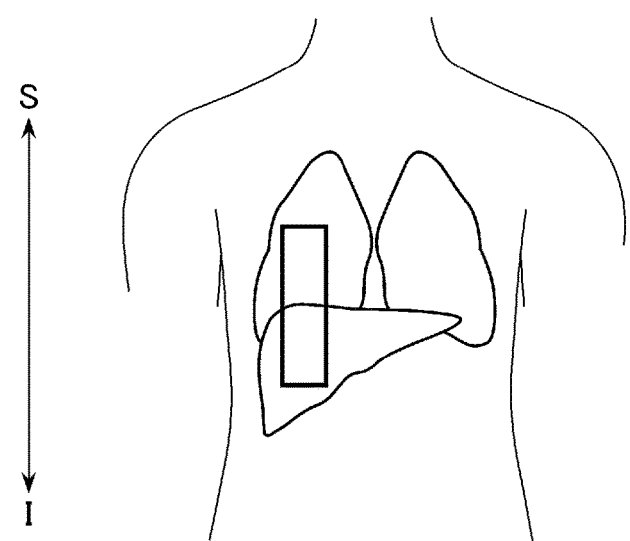
FIG. 4 is a diagram schematically illustrating an imaging region.

FIG. 3 is a diagram showing scans executed in the first exemplary embodiment, and FIG. 4 is a diagram schematically showing an imaging region, respectively.

In the exemplary embodiment, a prescan A and an actual scan B are executed.

The prescan A is a scan executed to determine a trigger level TL (refer FIG. 20) to be described later. The trigger level TL will be described later.

The actual scan B is a scan for imaging the liver.

The prescan A and the actual scan B will be explained in order below.

Figure 5:
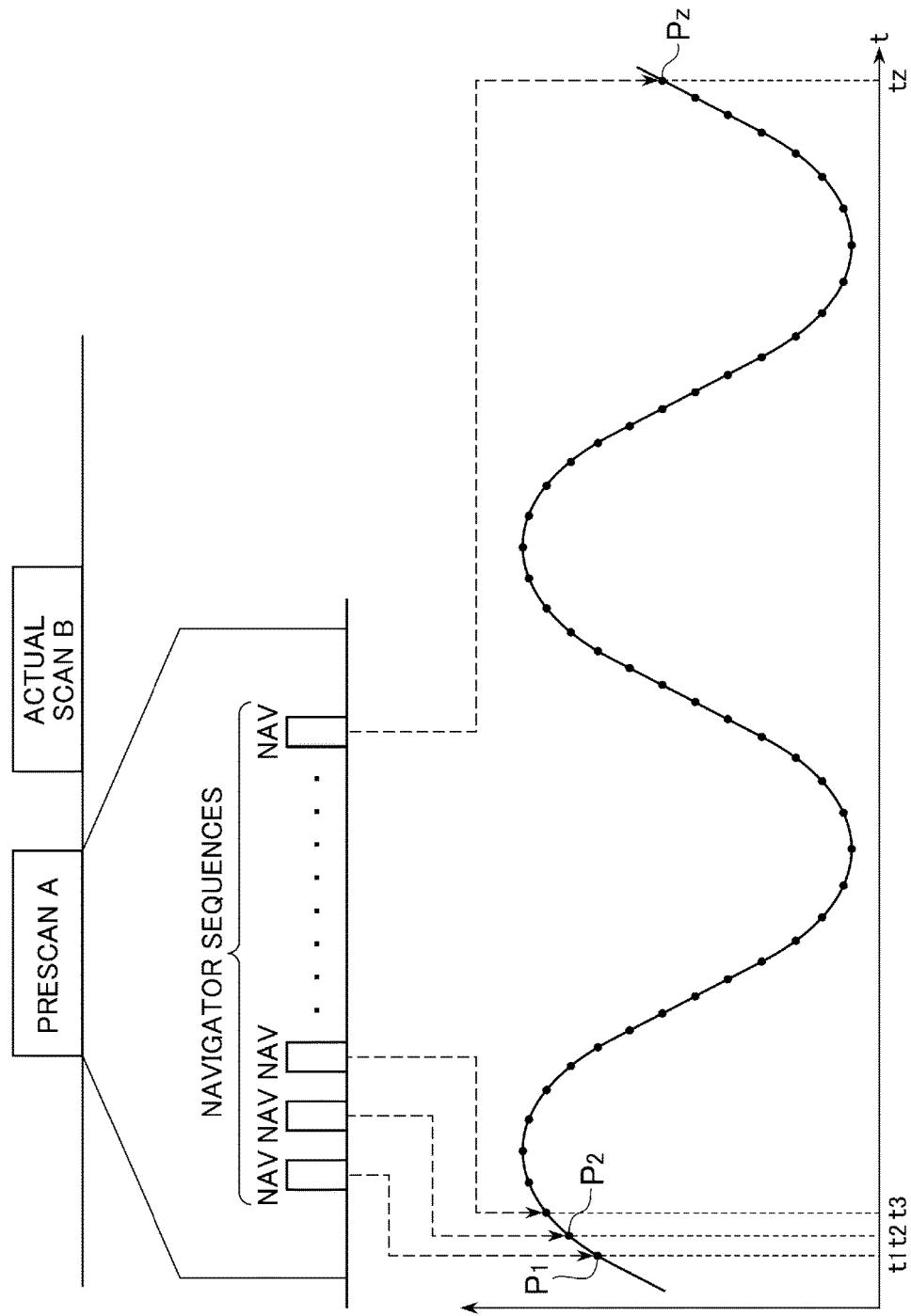
FIG. 5 is a diagram for describing each of sequences executed in a prescan A.

FIG. 5 is a diagram for describing each sequence executed in the prescan A.

A navigator sequence NAV is repeatedly executed in the prescan A. The navigator sequence NAV is a sequence for acquiring navigator signals from a navigator region Rnav.

Figure 6:
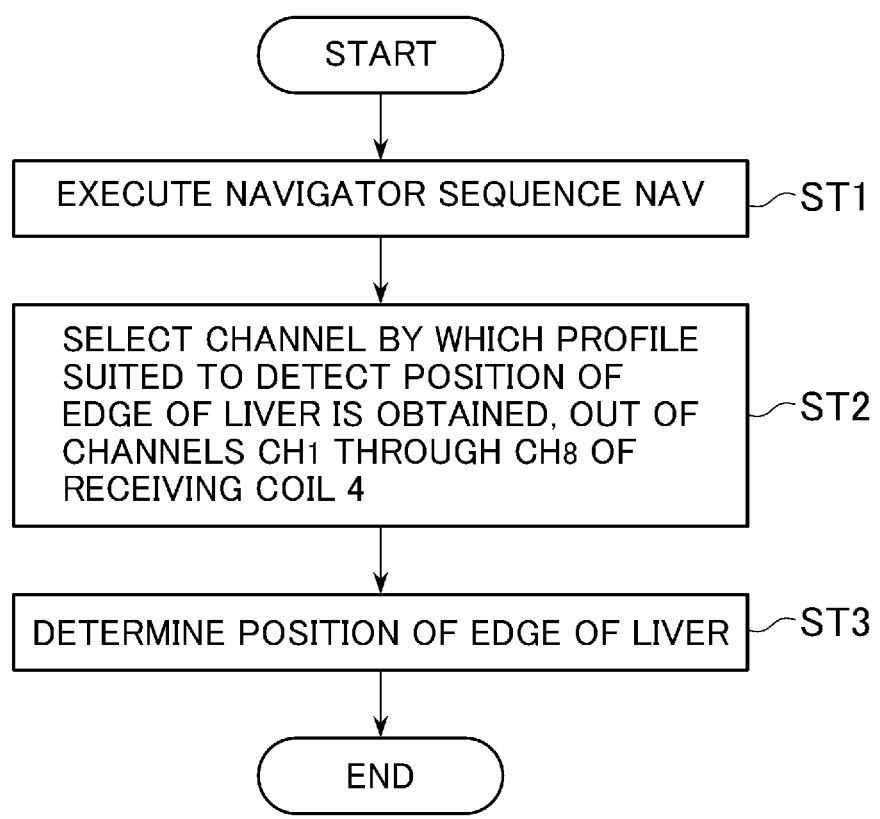
FIG. 6 is a diagram showing a flow taken when a navigator sequence NAV is executed at a time t1 and the position of an edge of a liver at the time t1 is detected.

In the prescan A, the navigator sequence NAV is first executed at a time t1 and thereby the position of the edge of the liver at the time t1 is detected (refer to FIG. 6).

FIG. 6 is a diagram showing a flow taken when the navigator sequence NAV is executed at the time t1 and the position of the edge of the liver at the time t1 is detected.

At Step ST1, the navigator sequence NAV is executed at the time t1. Navigator signals are acquired from the navigator region Rnav by executing the navigator sequence NAV. The navigator signals are received by the channels CH1 through CH8 of the receiving coil 4. The profile generating unit 71 (refer to FIG. 1) converts the navigator signals obtained for every CH1, . . . CH8 of the channels of the receiving coil 4 into profiles each indicative of a signal strength in an SI direction of the navigator region Rnav. Thus, the profile indicative of the SI-direction signal strength of the navigator region Rnav is generated for each channel of the receiving coil 4. The profiles F1 through F8 obtained for every CH1, . . . CH8 of the channels of the receiving coil 4 are schematically shown in FIG. 7. The navigator sequence NAV has been designed in such a manner that the liver becomes a high signal and the lung becomes a low signal. Accordingly, the position of the edge of the liver at the time t1 can be detected by detecting positions where the signal values of the profiles F1 through F8 abruptly change. For example, since the signal value abruptly changes at the position P0 when reference is made to the profile F3, the position P0 can be considered to be the position of the edge of the liver.

The signal value in a region on the lung side of the profile may increase due to a signal of a tissue (e.g., fat, blood) existing on the lung side. For example, as the profile F1 is compared with the profile F3, the signal value of the lung's region becomes larger. When the signal value of the lung's region becomes larger in like manner, there appears a position where the signal value abruptly changes, not only in the neighborhood of the edge of the liver but also in a location away from the edge of the liver toward the lung side, thereby leading to misdetection of the position of the edge of the liver. Thus, although the eight profiles F1 through F8 can be obtained by the channels CH1 through CH8, the profiles suited for the detection of the position of the edge of the liver cannot be obtained at any channel.

It is therefore necessary to select the channel by which each profile suited for the detection of the position of the edge of the liver is obtained, out of the channels CH1 through CH8. The flow proceeds to Step ST2 to select the channel.

At Step ST2, the channel by which the profile suited for the detection of the edge of the liver is obtained is selected from within the channels CH1 through CH8. A method of selecting a channel will be described in the exemplary embodiment, but a method of selecting a channel using the method proposed by Brau et al. will first be explained as a comparative example before the channel selecting method of the exemplary embodiment is explained.

Figure 8:
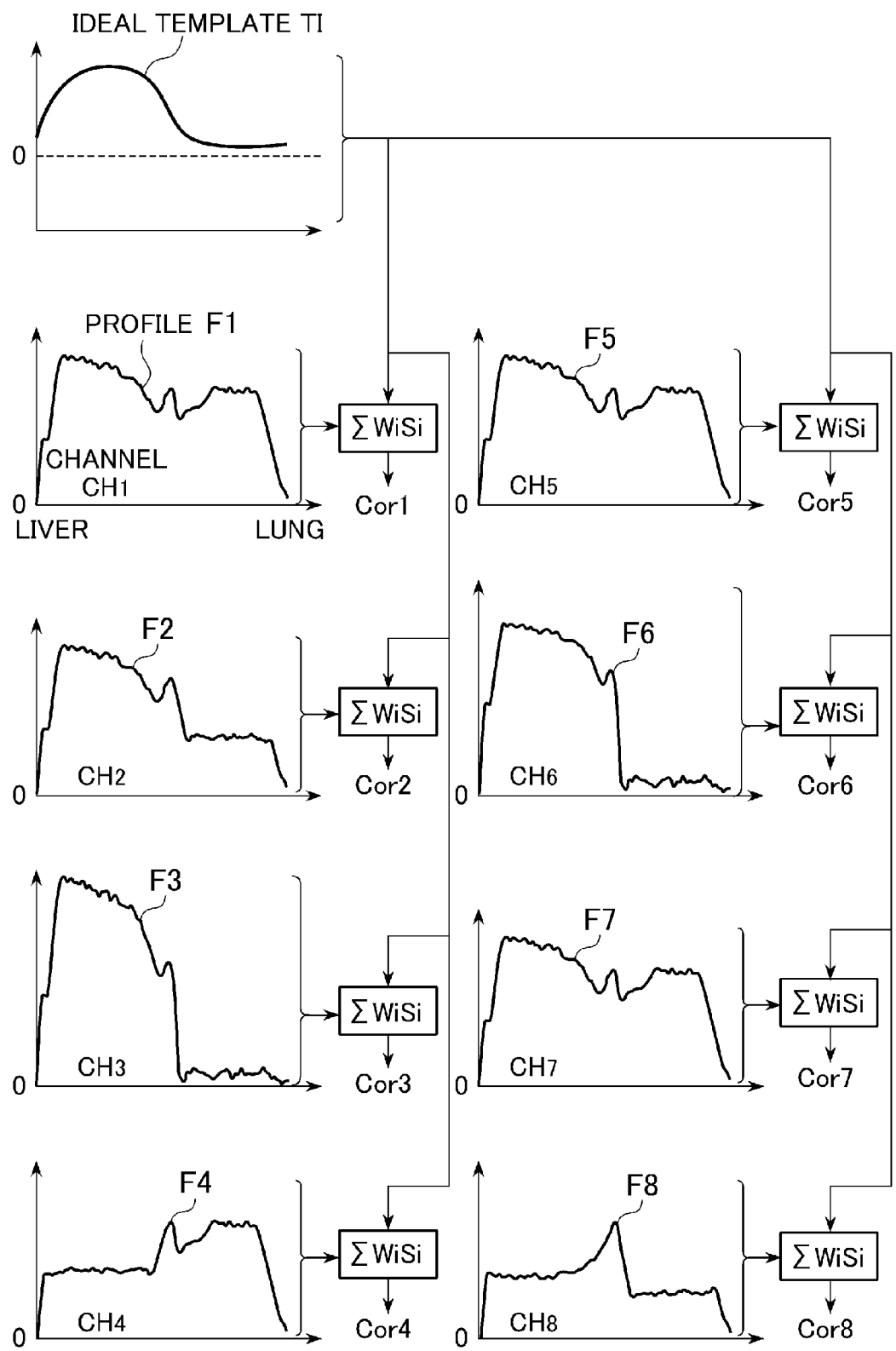
FIG. 8 is an explanatory diagram when correlation coefficients between an ideal template TI and the respective profiles F1 through F8 are determined.

In the method proposed by Brau et al, the ideal template TI shown in FIG. 25 is prepared, and the correlation coefficients between the ideal template TI and its corresponding profiles F1 through F8 are determined (refer to FIG. 8).

FIG. 8 is an explanatory diagram when the correlation coefficients between the ideal template TI and the respective profiles F1 through F8 are determined.

The correlation coefficient Cor is calculated by the following equation:

$$\mathrm{Cor} = \sum_{i=1}^{res} W_i S_i \qquad \text{Equation 1}$$

where Wi is a signal value of template at position i; and Si is a signal value of profile at position i.

In FIG. 8, the correlation coefficients are denoted by symbols "Cor1" through "Cor8". Now consider the correlation coefficient Cor1 between the profile F1 and the ideal template TI and the correlation coefficient Cor3 between the profile F3 and the ideal template TI while attention is being paid to the profile F1 of the profiles F1 through F8, in which the signal value on the lung side is large, and the profile F3 thereof in which the signal value on the lung side is small.

Figure 9:
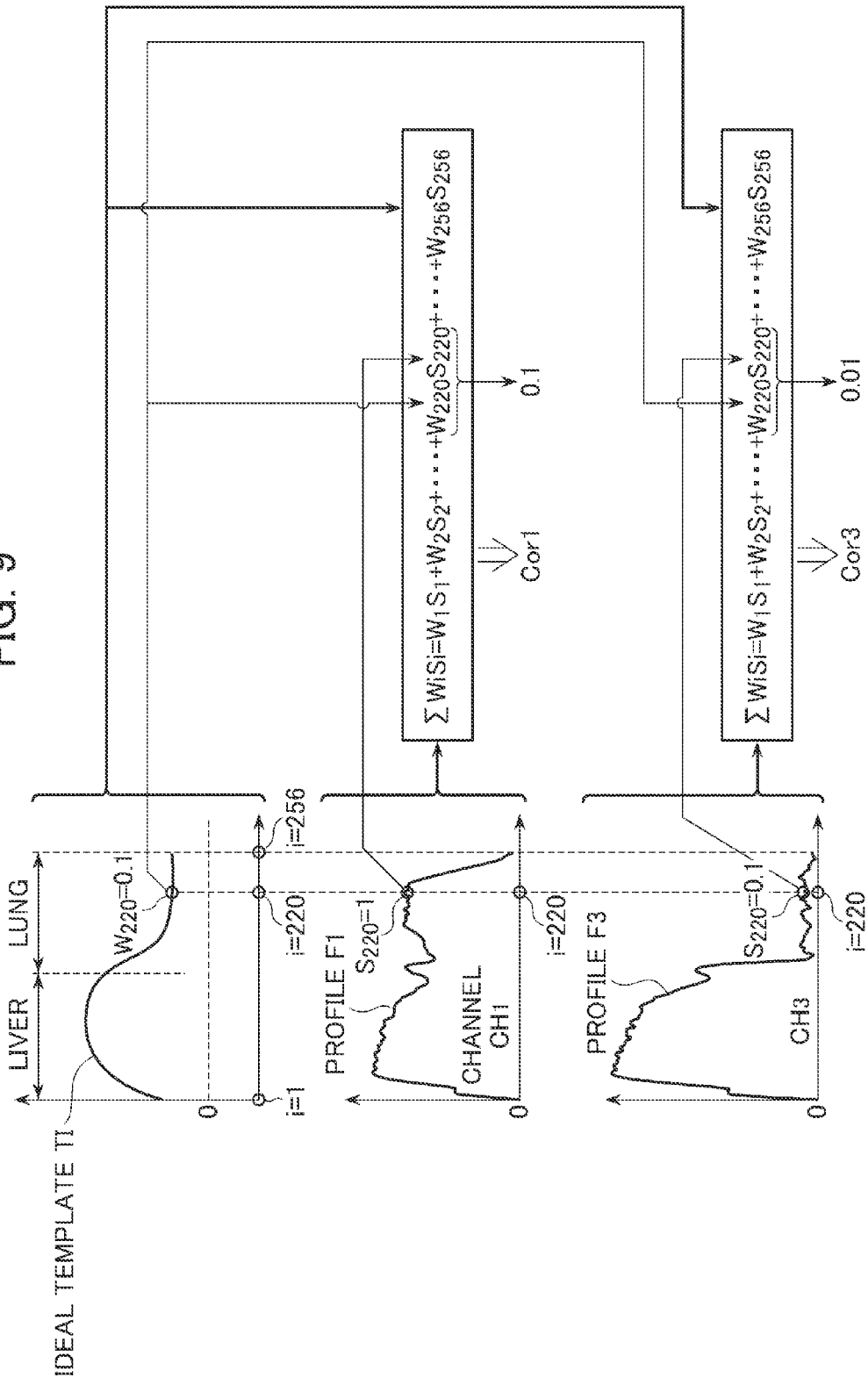
FIG. 9 is an explanatory diagram of a correlation coefficient Cor1 between the profile F1 and the ideal template TI and a correlation coefficient Cor3 between the profile F3 and the ideal template TI.

FIG. 9 is a diagram for describing the correlation coefficient Cor1 between the profile F1 and the ideal template TI and the correlation coefficient Cor3 between the profile F3 and the ideal template TI.

In FIG. 9, assume that the resolution res in an SI direction between the idea template TI and the profiles F1 and F3 is res=256. Accordingly, the range in the SI-direction for the ideal template TI and the profiles F1 and F3 is indicated by the position i=1 to 256.

Since res=256, the correlation coefficient Cor of the equation (1) is represented by the sum of values of WiSi at the position i=1 to 256. Now consider W220S220 at the position i=220.

In the ideal template TI, the signal value W220 at the position i=220 is "0.1". In the profile F1, the signal value S220 at the position i=220 is "1". Thus, in the case of the profile F1, the value of W220S220 at the position i=220 becomes W220S220=0.1×1=0.1.

On the other hand, the signal value S220 at the position i=220 is "0.1" in the profile F3. Thus, in the case of the profile F3, the value of W220S220 at the position i=220 becomes W220S220=0.1×0.1=0.01.

It is thus understood that the value of W220S220 obtained by the profile F1 is larger than that of W220S220 obtained by the profile F3.

Figure 10:
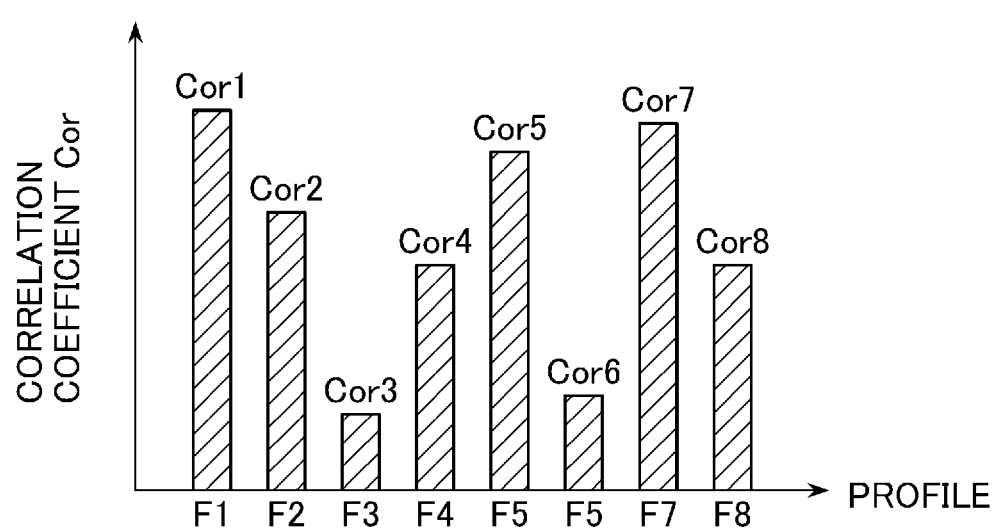
FIG. 10 is a diagram showing bar graphs schematically indicating differences between the values of the correlation coefficients Cor1 through Cor8.

The above description has been made of W220S220 at the position i=220, but WiSi obtained by the profile F1 is larger than WiSi obtained by the profile F3 in most regions of the lung. Thus, when each correlation coefficient Cor is calculated using the ideal template TI, the correlation coefficient Cor1 for the profile F1 in which the signal value in the region of the lung becomes larger than the correlation coefficient Cor3 for the profile F3 in which the signal value in the region of the lung is small. Although the correlation coefficient Cor1 for the profile F1 and the correlation coefficient Cor3 for the profile F3 have been described in FIG. 9, the larger the signal value in the region of the lung, the larger the correlation coefficient even in other profiles. FIG. 10 shows bar graphs schematically showing differences between the values of the correlation coefficients Cor1 through Cor8.

After the correlation coefficients Cor1 through Cor8 have been calculated, the profile where the correlation coefficient becomes largest, and the profile corresponding to the second largest correlation coefficient are selected out of the profiles F1 through F8. Referring to FIG. 10, it is understood that the correlation coefficient Cor1 for the profile F1 is the largest, and the correlation coefficient Cor7 for the profile F7 is large as the second. Accordingly, the profiles F1 and F7 are selected out of the profiles F1 through F8. The profile F1 is obtained from the channel CH1, and the profile F7 is obtained from the channel CH7. Thus, in the method of Brau, the channels CH1 and CH7 of the channels CH1 through CH8 are selected as the channels at which the profiles each suited for the detection of the position of the edge of the liver are obtained.

In each of the profiles F1 and F7 obtained by the channels CH1 and CH7, however, the signal value in the region of the lung becomes larger due to a signal of a tissue on the lung side as shown in FIG. 8. Therefore, the position where the signal value abruptly changes appears not only in the vicinity of the edge of the lung but also in a location away from the edge of the liver to the lung side. Thus, the detection of the position of the edge of the liver using the profile F1 obtained by the channel CH1 leads to misdetection of the position of the edge of the liver.

Figure 11:
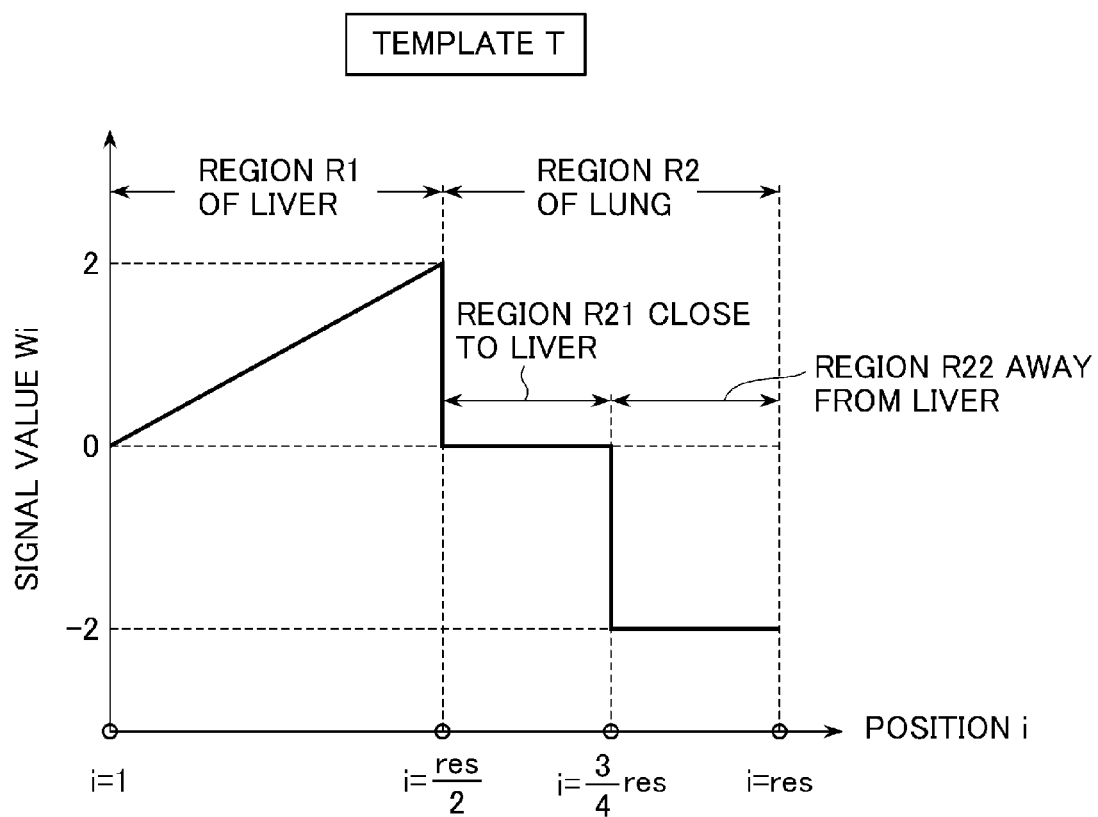
FIG. 11 is a diagram schematically illustrating a template T used in the exemplary embodiment.

Thus, in the exemplary embodiment, the correlation coefficients are calculated using a template different from the ideal template TI shown in FIG. 25. The template T used in the exemplary embodiment is schematically shown in FIG. 11.

A signal value Wi of the template T is represented by a function of monotonously increasing a signal value as it approaches the edge of the liver in a region R1 of the liver. On the other hand, in a region R2 of the lung, the signal value Wi differs between a region R21 close to the liver and a region R22 away from the liver. Described specifically, it is represented by the following function Wi:

$$W_i \begin{cases} 4(i-1)/res & \text{if } 1 \le i \le \frac{res}{2} \\ 0 & \text{if } \frac{res}{2} < i \le \frac{3res}{4} \\ -2 & \text{if } \frac{3res}{4} < i \le res \end{cases} \quad \text{Function 1}$$

where res is a resolution in SI direction of template T; and i is a position of pixel.

In the exemplary embodiment, the correlation coefficient calculating unit 72 (refer to FIG. 1) calculates a correlation coefficient Cor between the template T expressed in the function Wi and each profile.

Figure 12:
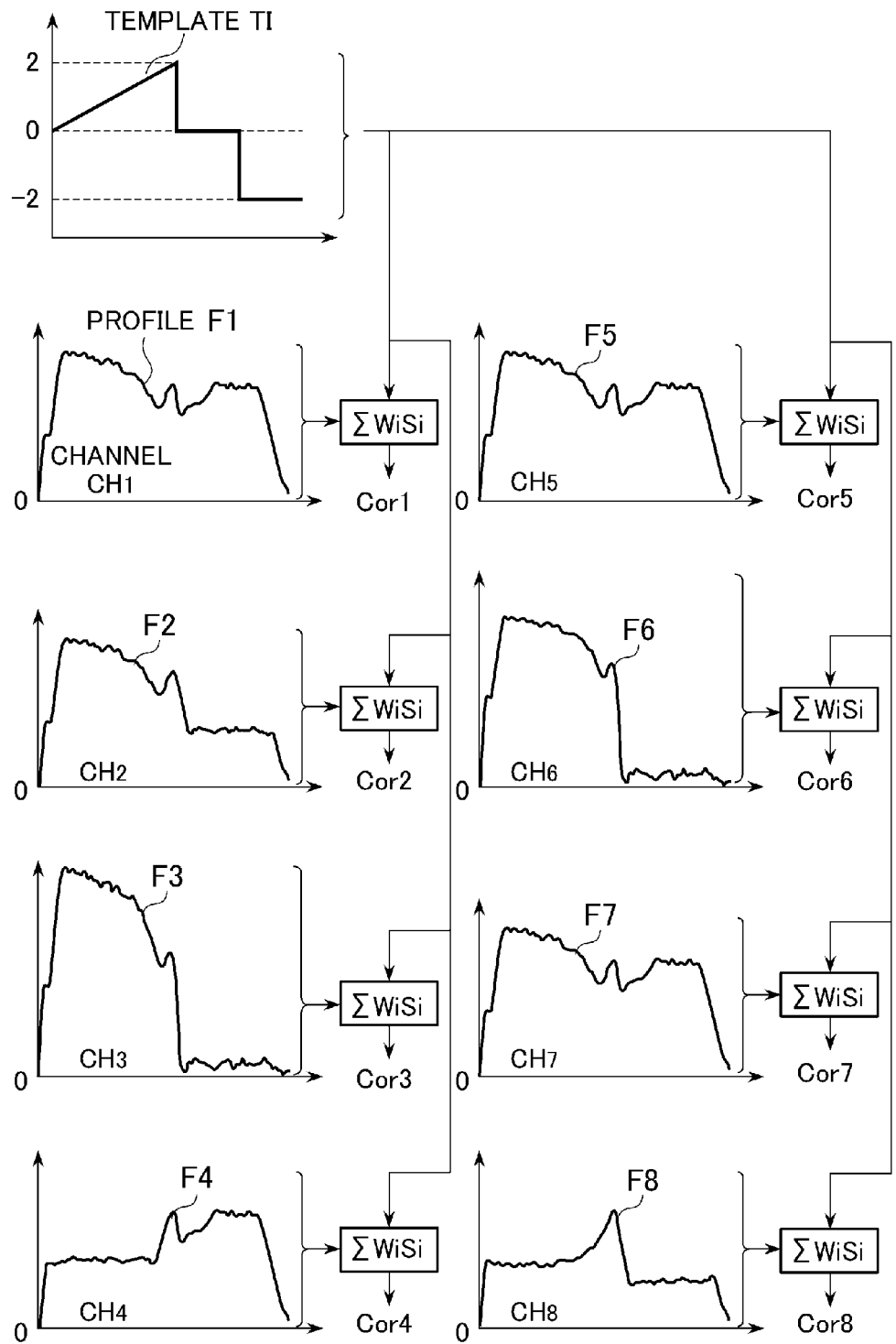
FIG. 12 is an explanatory diagram when correlation coefficients Cor are calculated.

FIG. 12 is an explanatory diagram when the correlation coefficients Cor are calculated. In FIG. 12, the correlation coefficients are represented by symbols "Cor1" through "Cor8". Here, attention is paid to the profile F1 of the profiles F1 through F8, which is large in signal value on the lung side, and the profile F3 thereof which is small in signal value on the lung side. Then, consider the correlation coefficient Cor1 between the profile F1 and the template T and the correlation coefficient Cor3 between the profile F3 and the template T.

Figure 13:
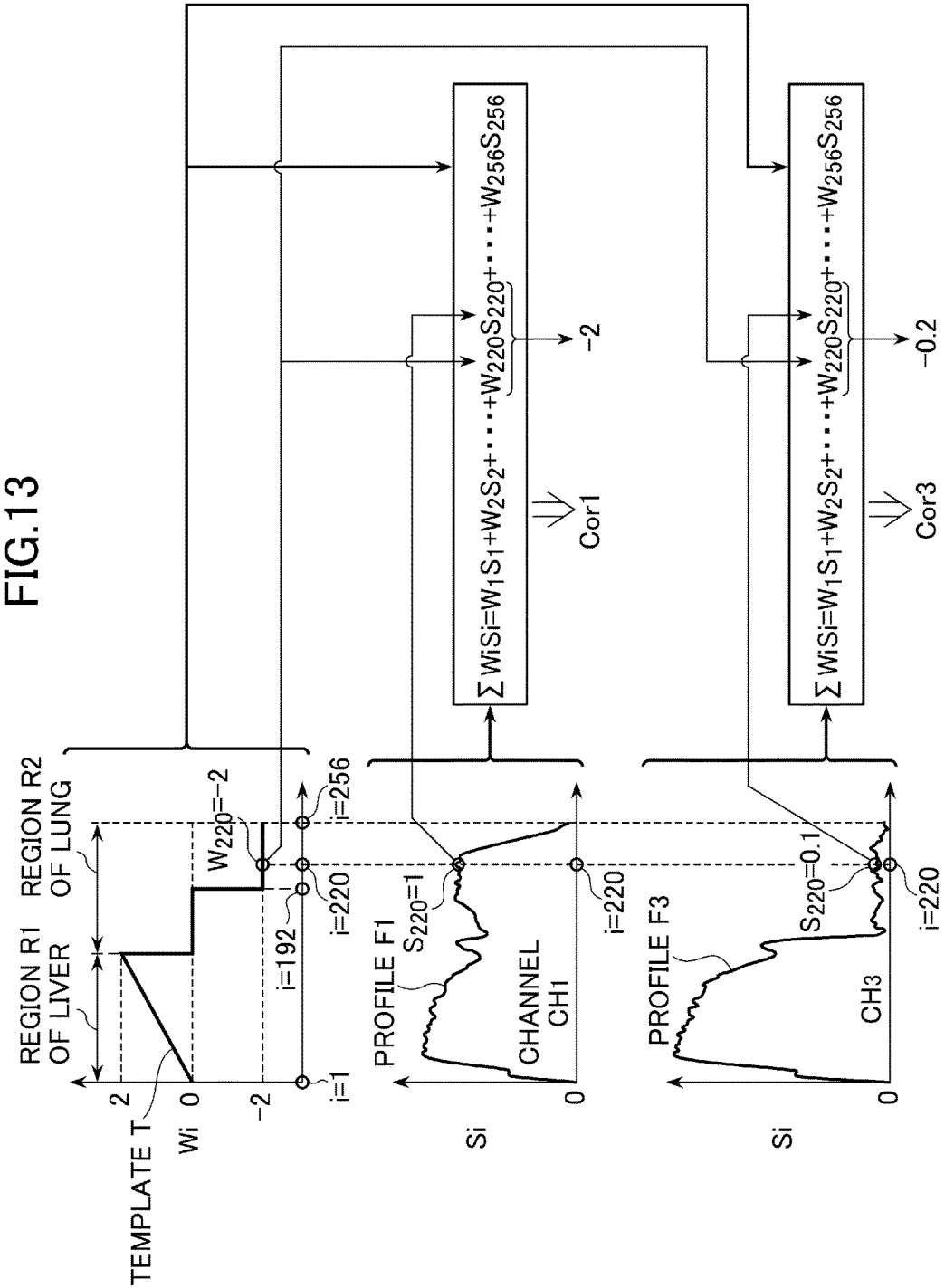
FIG. 13 is an explanatory diagram of a correlation coefficient Cor1 between a profile F1 and the template T and a correlation coefficient Cor3 between a profile F3 and the template T.

FIG. 13 is an explanatory diagram of the correlation coefficient Cor1 between the profile F1 and the template T and the correlation coefficient Cor3 between the profile F3 and the template T.

In FIG. 13, assume that the resolution res in an SI direction between the template T and the profiles F1 and F3 is res=256. Accordingly, the range in the SI direction for the template T and the profiles F1 and F3 is represented by a position i=1 to 256.

A signal value Si of each of the profiles F1 and F3 is zero or a positive value over the range in the SI direction. On the other hand, the signal value Wi of the template T is zero or a positive value in the range of the position i=192, but the signal value Wi becomes a negative value (−2) in the range of the position i=193 to 256.

Since res=256, the correlation coefficient Cor of the equation (1) is represented by the sum of the values of WiSi at the position i=1 to 256. Now consider W220S220 at the position i=220.

In the template T, the signal value W220 at the position i=220 is "−2". In the profile F1, the signal value S220 at the position i=220 is "1". Thus, in the case of the profile F1, the value of W220S220 at the position i=220 becomes W220S220=−2×1=−2.

On the other hand, the signal value S220 at the position i=220 is "0.1" in the profile F3. Thus, in the case of the profile F3, the value of W220S220 at the position i=220 becomes W220S220=−2×0.1=−0.2.

Thus, since W220S220 becomes a negative value, W220S220 has the effect of reducing the value of the correlation coefficient. However, although only 0.2 is subtracted by the term of W220S220 where the correlation coefficient Cor3 for the profile F3 is calculated, 2 is subtracted by W220S220 where the correlation coefficient Cor1 for the profile F1 is calculated. Thus, W220S220 obtained by the profile F1 enables the correlation coefficient to be subtracted greater than W220S220 obtained by the profile F3. Although W220S220 at the position i=220 has been taken up in the above description, WiSi obtained by the profile F1 enables a greater subtraction of correlation coefficients than WiSi obtained by the profile F3 in most of the range of the position i=193 to 256.

Figure 14:
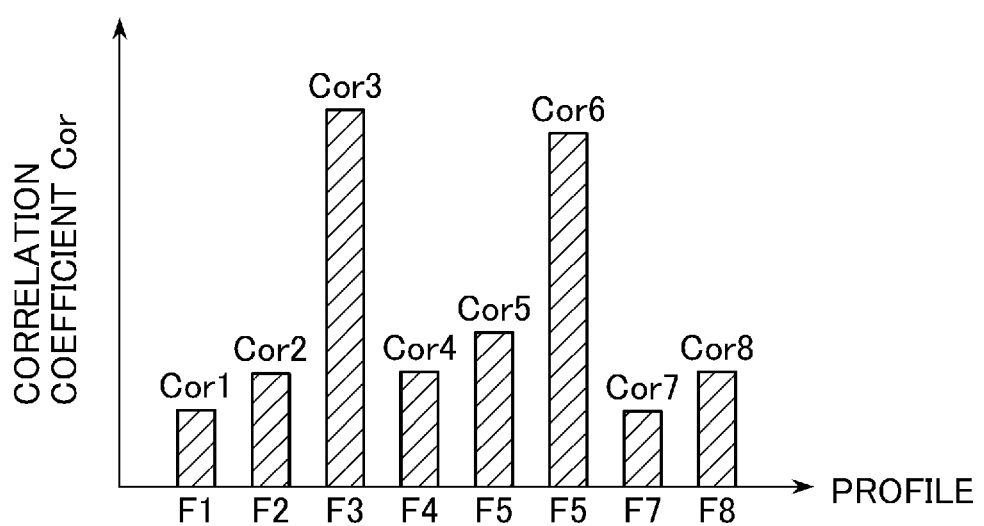
FIG. 14 is a diagram showing bar graphs schematically indicating differences between the values of the correlation coefficients Cor1 through Cor8.

Thus, when each correlation coefficient Cor is calculated using the template T, the correlation coefficient Cor1 for the profile F1 where the signal value in the region of the lung is large becomes smaller than the correlation coefficient Cor3 for the profile F3 where the signal value in the region of the lung is small. Although the profiles F1 and F3 have been described in FIG. 13, the larger the signal value in the region of the lung, the smaller the correlation coefficient even in other profiles. FIG. 14 shows bar graphs schematically depicting differences between the values of the correlation coefficients Cor1 through Cor8.

Thus, by using the template T, the correlation coefficient of the profile where the signal value in the region of the lung is large can be made smaller than the correlation coefficient of the profile where the signal value in the region of the lung is small.

After the correlation coefficients Cor1 through Cor8 have been calculated, the selecting unit 73 (refer to FIG. 1) selects the profile where the correlation coefficient Cor with the template T becomes largest, and the profile corresponding to the second largest correlation coefficient out of the profiles F1 through F8. Referring to FIG. 14, it is understood that the correlation coefficient Cor3 between the profile F3 and the template T becomes largest, and the correlation coefficient Cor6 between the profile F6 and the template T is large as the second. Accordingly, the selecting unit 73 selects the profiles F3 and F6.

Figure 15:
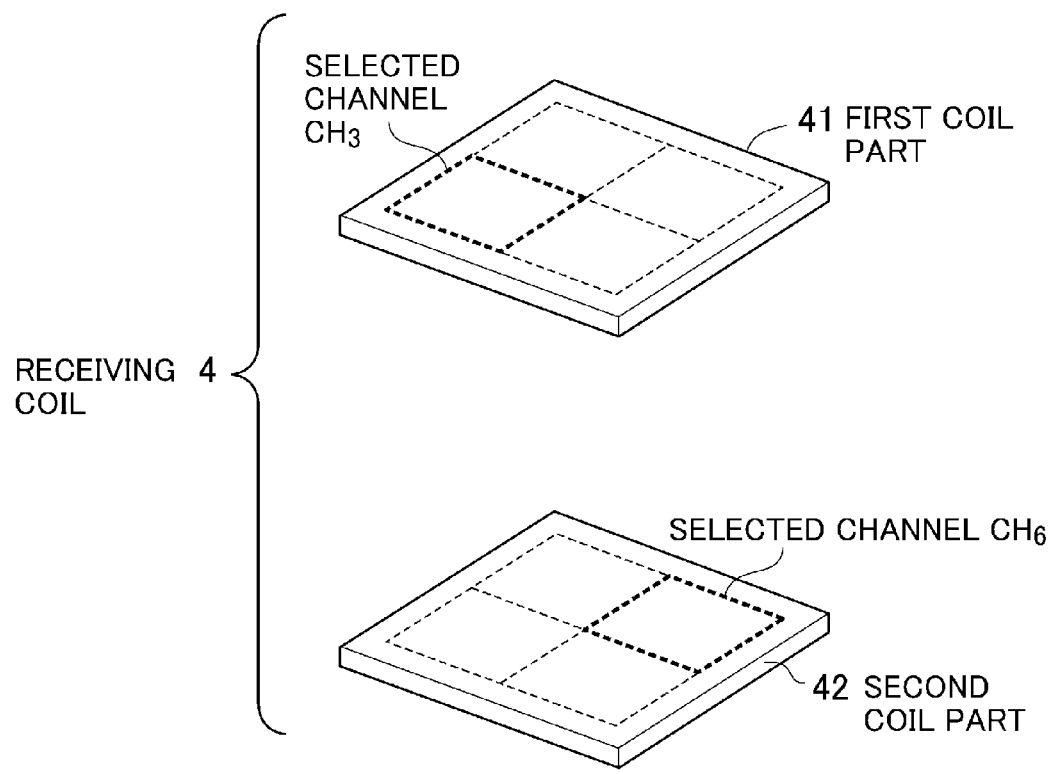
FIG. 15 is a diagram schematically showing the selected channels CH3 and CH6.

The profile F3 is obtained from the channel CH1, and the profile F6 is obtained from the channel CH6. Thus, the selecting unit 73 selects the channels CH3 and CH6 of the channels CH1 through CH8 of the receiving coil 4 as the channels at which the profiles each suited to detect the position of the edge of the liver are obtained. FIG. 15 schematically shows the selected channels CH3 and CH6. After the channels CH3 and CH6 have been selected, the flow proceeds to Step ST3.

Figure 16:
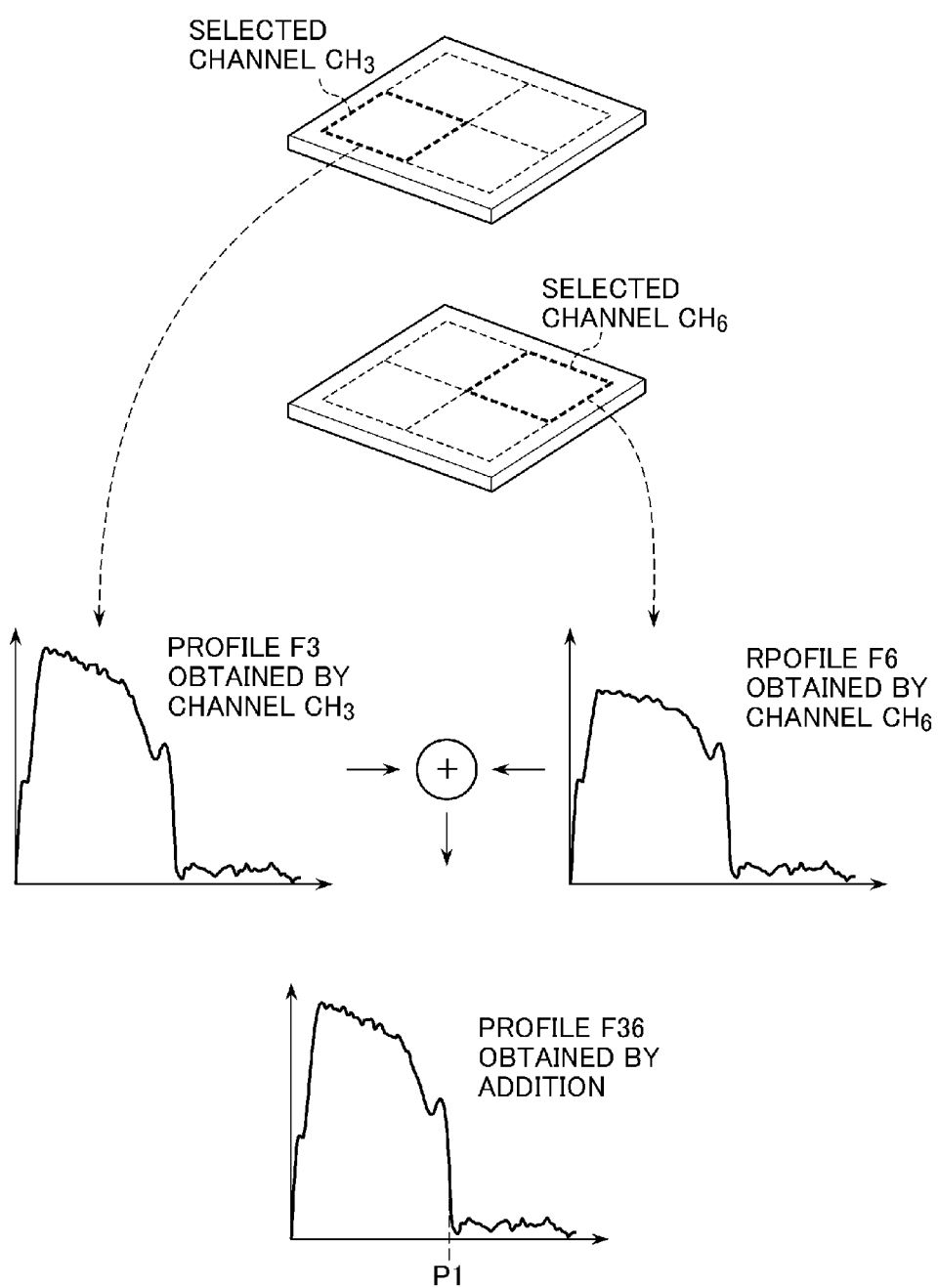
FIG. 16 is an explanatory diagram when the position of an edge of a liver is determined.

At Step ST3, the position detecting unit 74 (refer to FIG. 1) determines the position of the edge of the liver at the time t1 (refer to FIG. 16).

FIG. 16 is an explanatory diagram when the position of the edge of the liver is determined.

The position detecting unit 74 adds the profile F3 obtained by the channel CH3 and the profile F6 obtained by the channel CH6.

The position detecting unit 74 detects a position P1 where a signal value abruptly changes, from a profile F36 obtained by the above addition. It is thus possible to detect the position P1 (refer to FIG. 5) of the edge of the liver at the time t1. Since an SN ratio can be made large by the addition of the profiles F3 and F6, it is possible to improve the detection accuracy of the position of the liver's edge. After the edge position P1 has been determined, the flow of FIG. 6 is ended.

After the detection of the position P1 of the liver's edge at the time t1, the navigator sequence is executed at the next time t2.

Figure 17:
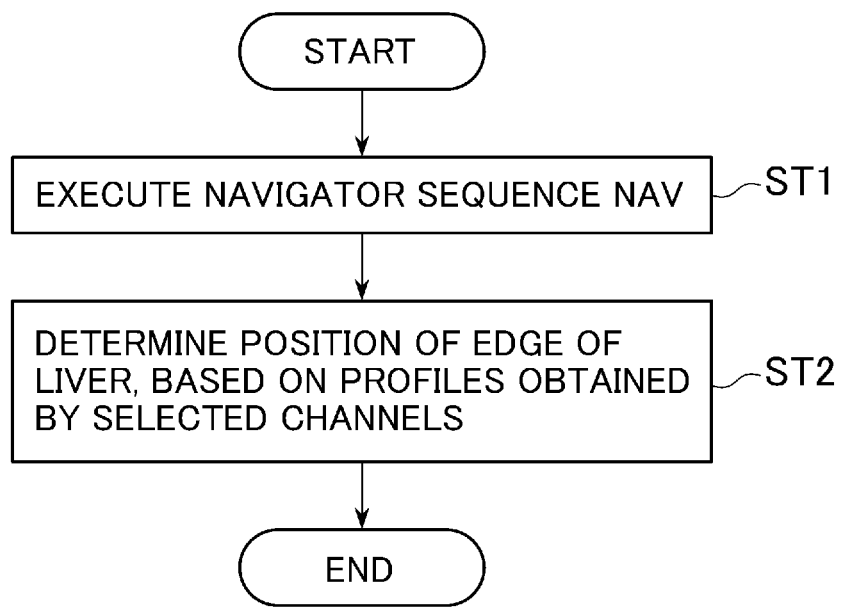
FIG. 17 is a diagram showing a flow when the navigator sequence NAV is executed at a time t2 and the position of the edge of the liver at the time t2 is detected.

FIG. 17 is a diagram showing a flow when the navigator sequence NAV is executed at the time t2 and thereby the position of the edge of the liver at the time t2 is detected.

Figure 18:
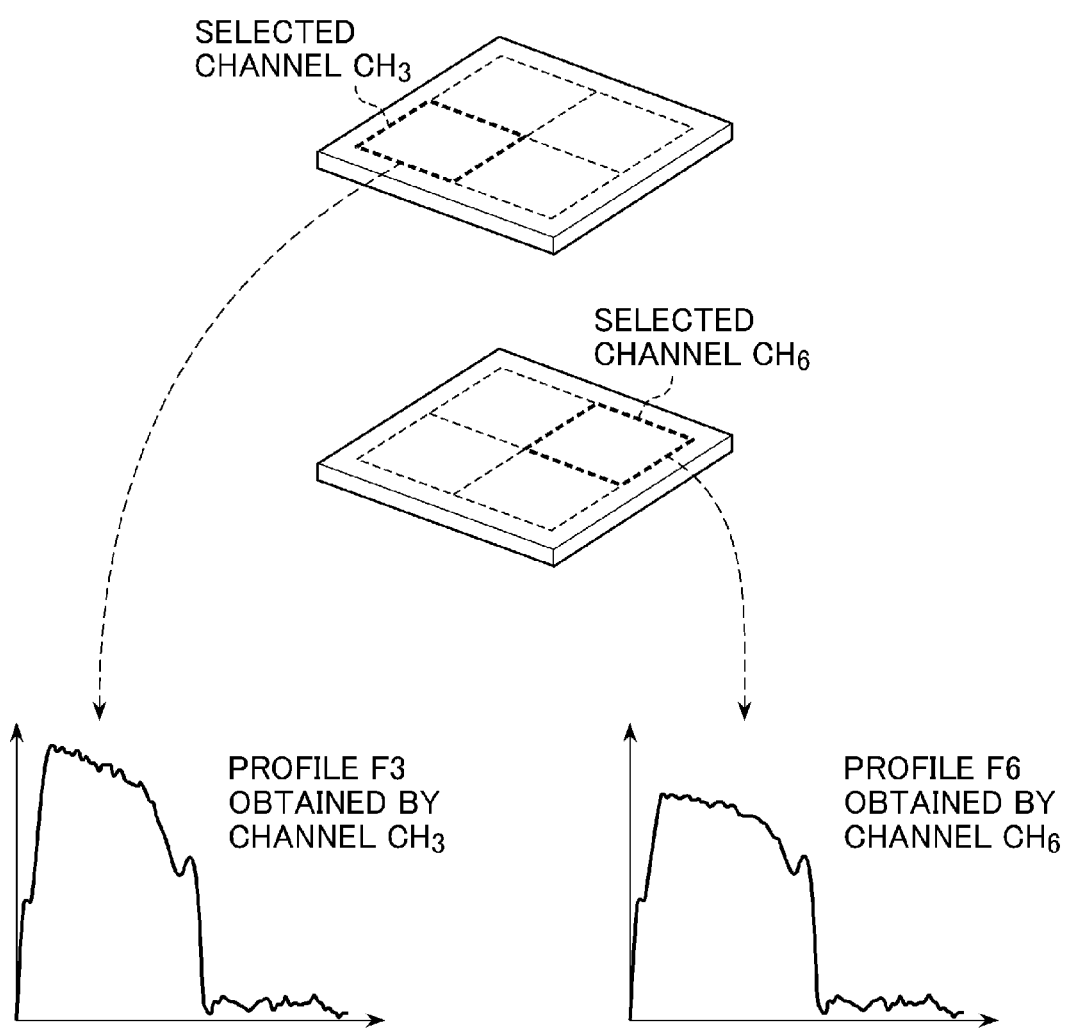
FIG. 18 is a diagram schematically showing profiles F3 and F6 obtained by the channels CH3 and CH6 of the receiving coil 4.
Figure 19:
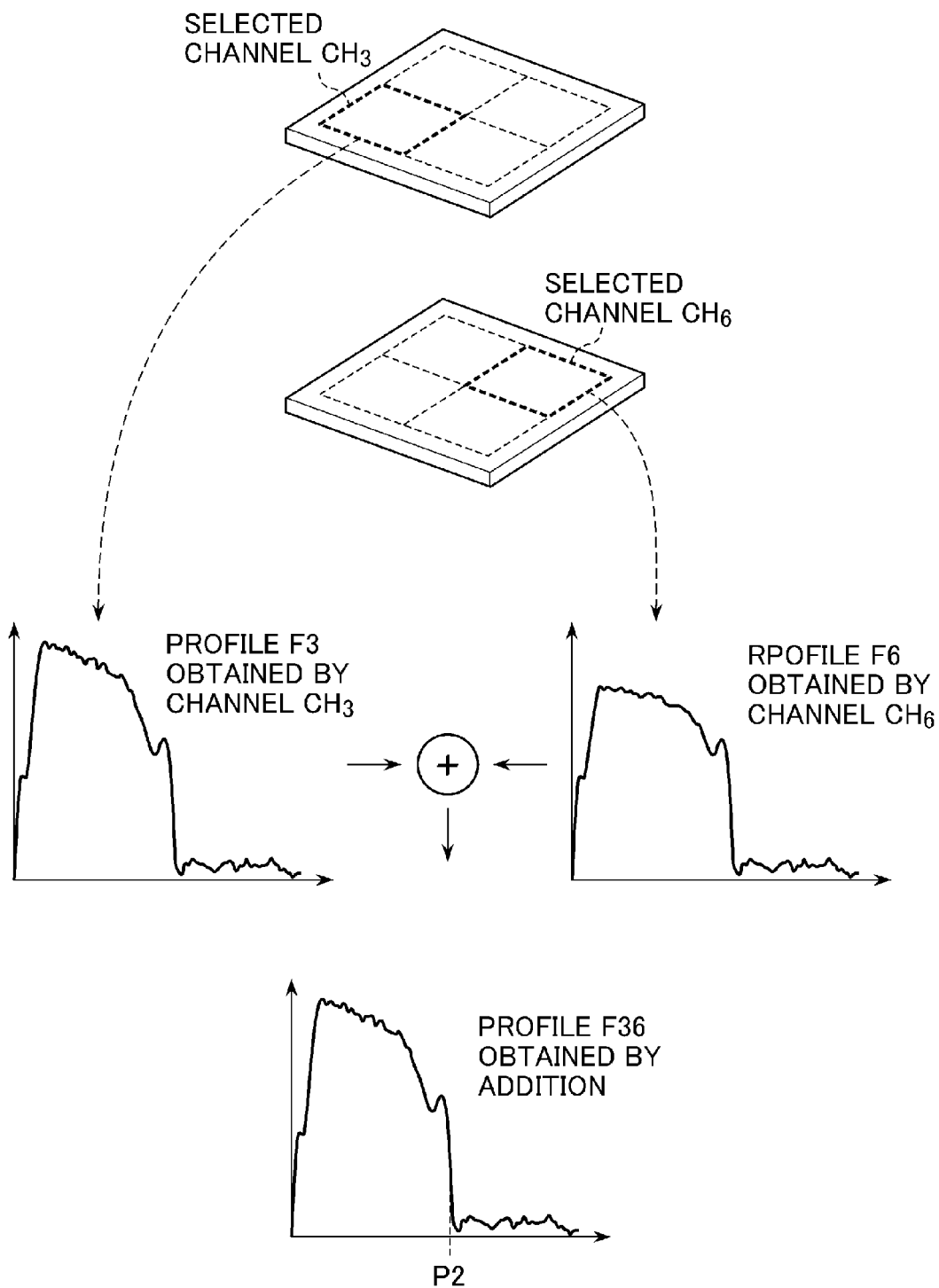
FIG. 19 is a diagram schematically illustrating a profile F36 obtained by addition.

At Step ST1, the navigator sequence NAV is executed at the time t2. Navigator signals are acquired from the navigator region Rnav by executing the navigator sequence NAV. The profile generating unit 71 (refer to FIG. 1) converts the navigator signals received by the previously-selected channels CH3 and CH6 (refer to FIG. 15) to profiles each indicative of an SI-direction signal strength of the navigator region Rnav. Thus, the profile is generated for each of the channels CH3 and CH6. The generated profiles F3 and F6 are schematically shown in FIG. 18. After the profiles F3 and F6 have been obtained, the position detecting unit 74 adds the profile F3 obtained by the channel CH3 and the profile F6 obtained by the channel CH6. A profile F36 obtained by the addition is schematically shown in FIG. 19.

The position detecting unit 74 detects a position P2 where a signal value abruptly changes, from the profile F36 obtained by the addition. It is thus possible to detect the position P2 (refer to FIG. 5) of the edge of the liver at the time t2.

Subsequently, in the same manner as above, the navigator sequences NAV are executed in accordance with the flow shown in FIG. 17 even at the times t3 through tz (refer to FIG. 5) to generate profiles each indicative of an SI-direction signal strength of the navigator region Rnav, using the navigator signals received by the selected channels CH3 and CH6. Then, the profile F3 obtained by the channel CH3 and the profile F6 obtained by the channel CH6 are added together, and the position of the edge of the liver is detected from a profile F36 obtained by the addition.

Figure 20:
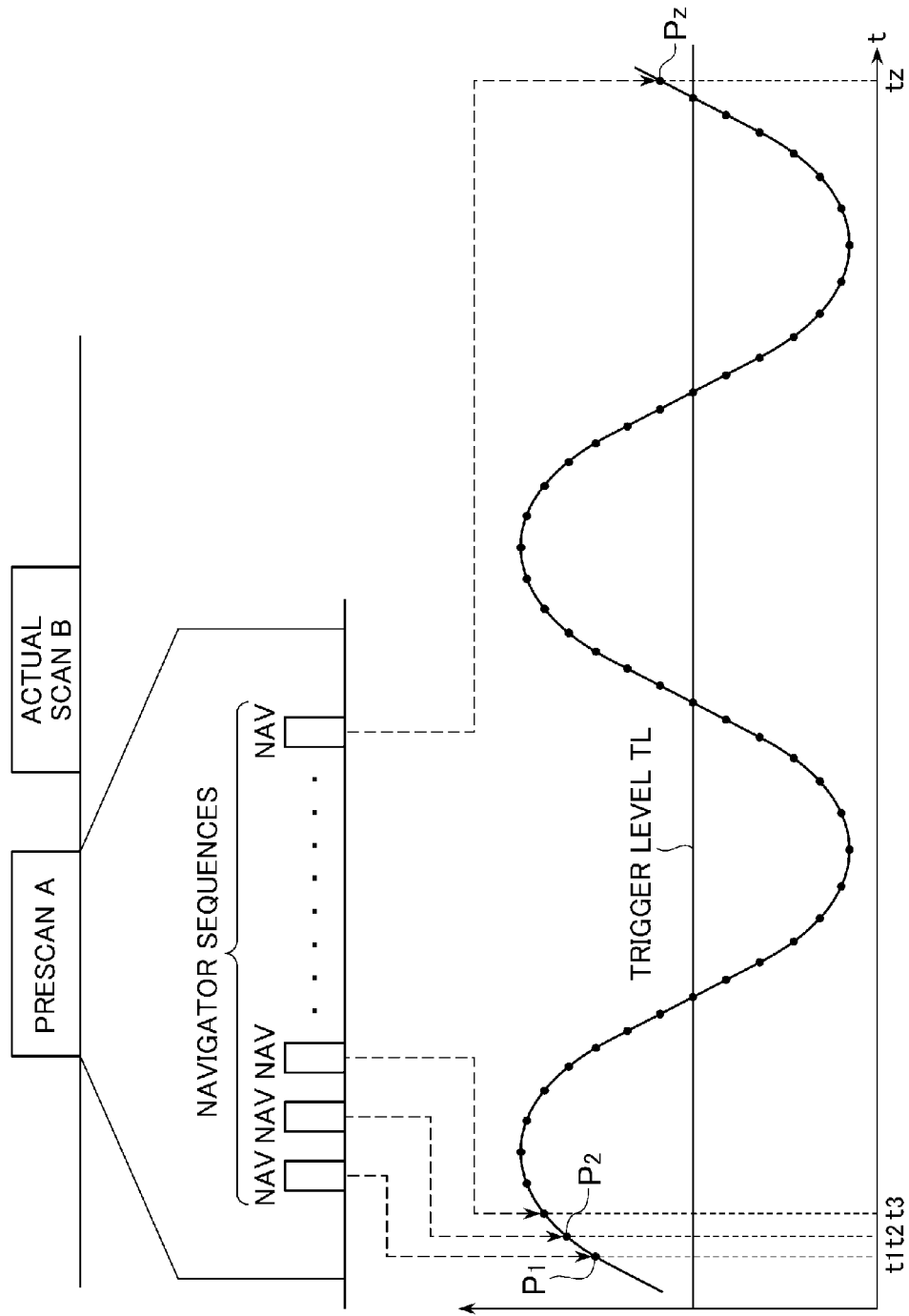
FIG. 20 is a diagram showing one example of a trigger level TL.

It is thus possible to acquire data about the positions P1 through Pz of the edges of the liver at the time t1 through tz as shown in FIG. 5. After the acquisition of the data, a trigger level TL is determined based on the data of the positions P1 through Pz of the liver's edges. FIG. 20 is a diagram showing one example of the trigger level TL. The trigger level TL indicates a reference position of the liver's edge when a data acquisition sequence DAQ (refer to FIG. 21) is executed in an actual scan B to be described later. The trigger level TL can be set midway between the maximum value of the position of the edge of the liver and the minimum value thereof, for example. A description will be described later of how the trigger level TL is used when the actual scan B is executed.

After the prescan A has been executed, the actual scan B is performed.

Figure 21:
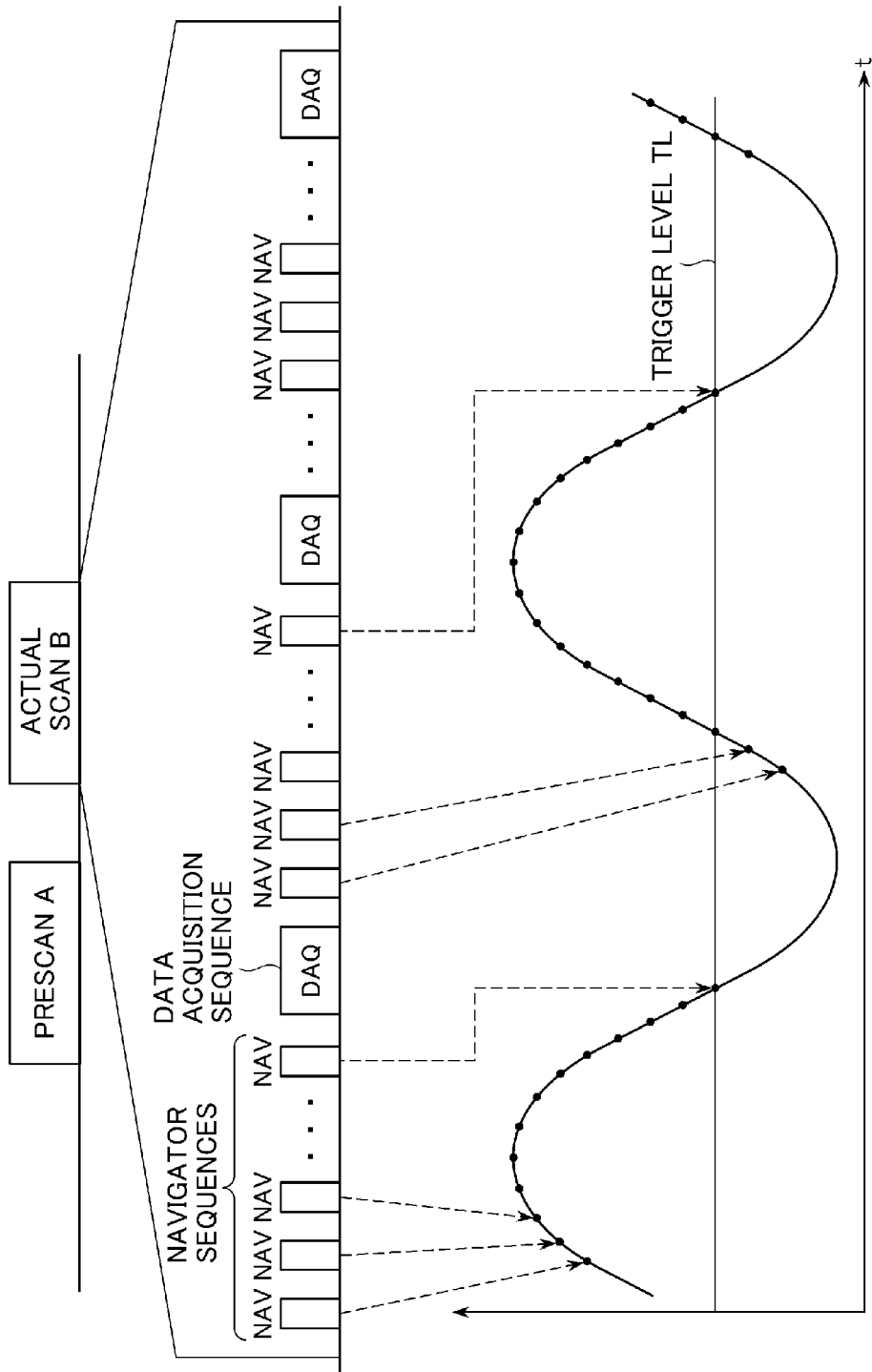
FIG. 21 is an explanatory diagram of a prescan B.

FIG. 21 is a diagram for describing the actual scan B.

In the actual scan B, navigator sequences NAV and data acquisition sequences DAQ for acquiring data of a liver are executed.

Even in the actual scan B, the navigator sequences NAV are executed in accordance with the flow shown in FIG. 17, and thereby profiles each indicative of an SI-direction signal strength of a navigator region Rnav are generated using navigator signals received by selected channels CH3 and CH6. Then, the profile obtained by one channel and the profile obtained by another channel are added together, and the position of the edge of the liver is detected from a profile obtained by the addition.

Thus, when a time change in the position of the edge of the liver is monitored, and the position of the edge of the liver is moved from the upper side of a trigger level TL to its lower side, the data acquisition sequence DAQ is executed.

Subsequently, in the same manner as above, the navigator sequence NAV and the data acquisition sequence DAQ are repeatedly executed respectively, and the actual scan B is ended. An image of the liver is reconstructed based on data acquired by the actual scan B, and the imaging of the subject is ended.

In the template T used in the exemplary embodiment, the signal value in the region R21 close to the liver is zero in the region R2 on the lung side, but the signal value in the region R22 away from the liver is set to −2 within the region R2 (refer to FIG. 11). By using such a template T, the correlation coefficient with the template T becomes small in the profile where the signal value in the region for the lung is large, but in the profile where the signal value in the region for the lung is small, the correlation coefficient with the template T becomes large. Accordingly, each channel less susceptible to the signal in the region for the lung can be selected out of the channels CH1 through CH8.

Incidentally, in the exemplary embodiment, the profile F3 where the correlation coefficient becomes maximal and the profile F6 where the correlation coefficient is large as the second are selected out of the profiles F1 through F8. However, only the profile F3 where the correlation coefficient becomes maximal is selected, and the position of the edge of the liver may be detected using only the profile F3. Three or more profiles are selected out of the profiles F1 through F8 in the descending order of correlation coefficients, and the positions of the edges of the liver may be detected based on the selected three or more profiles.

In the exemplary embodiment as well, the template T shown in FIG. 11 is used. Another template may however be used instead of the template T (refer to FIG. 22).

Figure 22:
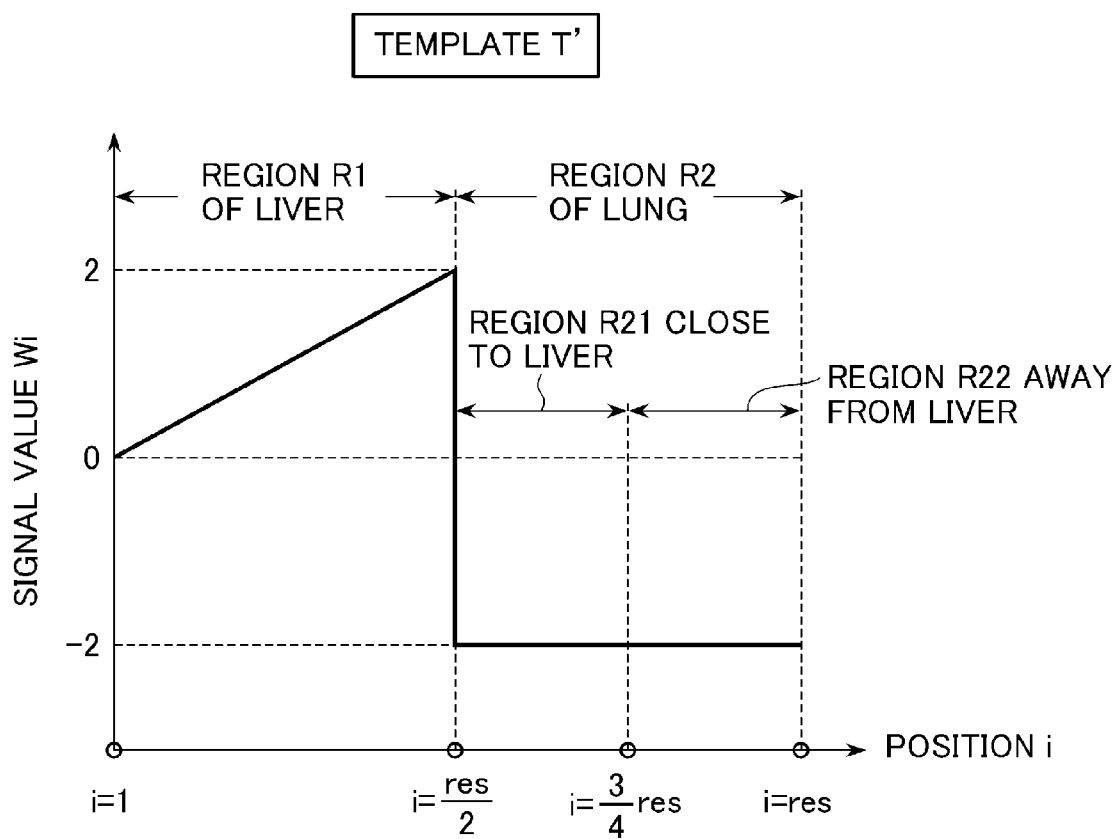
FIG. 22 is a diagram for describing another template T' usable in the exemplary embodiment.

FIG. 22 is a diagram for describing another template T' usable in the exemplary embodiment.

In the template T' shown in FIG. 22, a signal value Wi in a lung region R2 is Wi=−2. A correlation coefficient for a profile where the signal value in the lung region is large can be made smaller even though such a template T' is used. It is thus possible to select the channels less susceptible to each signal in the region for the lung out of the channels CH1 through CH8.

Incidentally, when the correlation coefficients are calculated, the template T shown in FIG. 11 may be used or the template T' shown in FIG. 22 may be used. The template T shown in FIG. 11 may be used instead of the template T' shown in FIG. 22. This reason will be described while referring to FIGS. 23A and 23B.

FIGS. 23A and 23B are diagrams for explaining the reason why the template T is suitably usable.

FIG. 23A is an explanatory diagram when the correlation coefficient between the template T shown in FIG. 11 and its corresponding profile F3 is calculated, and FIG. 23B is an explanatory diagram when the correlation coefficient between the template T' shown in FIG. 22 and its corresponding profile F3 is calculated.

Incidentally, in FIGS. 23A and 23B, a resolution res in an SI direction of each template is taken to be res=256.

FIG. 23A will first be explained.

Since the edge of the liver moves in the SI direction with breathing movements of a subject, the edge of the liver may enter into the inside of the lung region in the template. FIG. 23A shows the manner in which a position i=135 enters into the region R2 of the lung in the template T.

In the template T, the signal value Wi at the position i=129 to 196 has been set to Wi=0. Thus, the signal value W135 of the template T at the position i=135 is W135=0. On the other hand, in the profile F3, the signal value S135 at the position i=135 is S135=0.5. Thus, when the correlation coefficient between the template T and the profile F3 is calculated, the value of W135S135 at the position i=135 becomes W135S135=0×0.5=0.

On the other hand, when reference is made to FIG. 23B, the signal value Wi at the position i=129 to 192 has been set to Wi=−2 in the template T'. Therefore, the signal value W135 of the template T' at the position i=135 is W135=−2. Thus, when the correlation coefficient between the template T' and the profile F3 is calculated, the value of W135S135 at the position i=135 becomes W135S135=−2×0.5=−1.

Thus, since the signal value Wi at the position i=135 of the edge of the liver is "−2" in the template T', W135S135 becomes a negative value so that the correlation coefficient becomes small. Therefore, the template T may be used instead of the template T' to prevent the correlation coefficient from becoming small. Incidentally, when the effect exerted on the correlation coefficient is not so large even though WiSi is brought to the negative value at the position of the liver's edge (and in its neighboring range), the template T' can be used.

Figure 24:
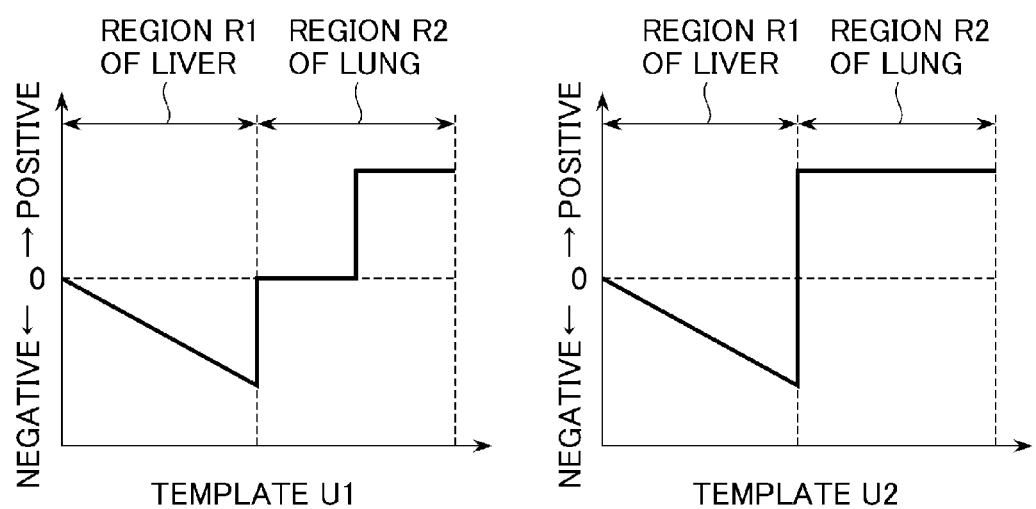
FIG. 24 is a diagram showing templates T and T' of which the polarities of signal values have been inverted.

Incidentally, the template used is not limited to the templates T and T' shown in FIGS. 11 and 22. For example, the signal value Wi in the region R22 away from the liver has been set to "−2" in the template T shown in FIG. 11, and the signal value Wi in the region R2 of the lung has been set to "−2" in the template T' shown in FIG. 22, but they may be set to a negative value different from "−2". In the exemplary embodiment as well, the signal value in the region of the liver in the template has been set to the positive value, and the signal value in the region of the lung in the template has been set to the negative value (and zero). If, however, the appropriate channel can be selected out of the channels CH1 through CH8, it is also possible to set a signal value in a region R1 of a liver in a template to a negative value and set a signal value in a region R2 of a lung in the template to a positive value (and zero) as shown in FIG. 24.

Incidentally, the exemplary embodiment has described the example in which the navigator signals are obtained by the eight-channel coil. The disclosure is however not limited to the eight-channel coil, but can be applied to a case where navigator signals are acquired by a coil having two or more channels.

Although the navigator region Rnav has been set to include the liver and the lung in the exemplary embodiment, it may include a portion different from the liver or the lung if a body moving portion is included therein. For example, the navigator region Rnav may be set to include the liver and the lung.

In the exemplary embodiment, the channels CH3 and CH6 used to detect the position of the edge of the liver have been selected out of the channels CH1 through CH8, based on the navigator signals obtained by the navigator sequence NAV at the time t1 in the prescan A. However, the navigator sequence NAV for selecting the channels is executed twice or more, and the channels may be selected based on navigator signals obtained by the respective navigator sequences NAV.

In the exemplary embodiment, the channels CH3 and CH6 have been selected based on the navigator signals obtained by the navigator sequence NAV at the time t1. Then, after the time t2, the position of the edge of the liver has been detected based on the navigator signals received by the channels CH3 and CH6. The channels may be selected each time the navigator sequence NAV is executed.

Although the exemplary embodiment has described the example in which each data acquisition sequence DAQ is performed by triggering, the disclosure is not limited to the triggering, but can be applied to any imaging if there is provided imaging necessary to receive navigator signals by a coil having a plurality of channels.

Many widely different embodiments of the systems and methods described herein may be configured without departing from the spirit and the scope of the present invention. It should be understood that the disclosure is not limited to the specific embodiments described in the specification, except as defined in the appended claim.

What is claimed is:

1. A magnetic resonance apparatus which acquires navigator signals generated from a navigator region including a body-moving first portion and a body-moving second portion, the navigator signals acquired using a coil having a plurality of channels, the magnetic resonance apparatus comprising:
   a scan unit configured to execute a first navigator sequence for acquiring first navigator signals generated from the navigator region using the coil;
   a profile generating unit configured to generate first profiles each including position information on the first portion for every channel, based on the first navigator signals received by the respective channels;
   a determining unit configured to determine correlations between the first profiles and a template indicative of a profile of reference for the navigator region, based on signal values of the first profiles and a signal value of the template; and
   a selecting unit configured to select, out of the channels, each channel used to acquire the position information on the first portion, based on the correlations, wherein the signal value of the template includes a signal value of a first polarity in a region for the first portion, and includes a signal value of a second polarity opposite to the first polarity in a region for the second portion.

2. The magnetic resonance apparatus of claim 1, wherein the signal value of the template is set to a constant value in the second portion region.

3. The magnetic resonance apparatus of claim 1, wherein the signal value of the template is set in such a manner that a signal value in a first subregion of the second portion region that is close to the first portion is different from a signal value in a second subregion of the second portion region that is away from the first portion.

4. The magnetic resonance apparatus of claim 3, wherein the signal value of the template is set to zero in the first subregion and set to the signal value of the second polarity in the second subregion.

5. The magnetic resonance apparatus according to claim 1, wherein the scan unit is configured to execute a second navigator sequence for acquiring second navigator signals generated from the navigator region using the coil, and wherein the profile generating unit is configured to generate a second profile including the position information on the first portion, based on the second navigator signal received by the channel selected by the selecting unit.

6. The magnetic resonance apparatus of claim 2, wherein the scan unit is configured to execute a second navigator sequence for acquiring second navigator signals generated from the navigator region using the coil, and wherein the profile generating unit is configured to generate a second profile including the position information on the first portion, based on the second navigator signal received by the channel selected by the selecting unit.

7. The magnetic resonance apparatus of claim 3, wherein the scan unit is configured to execute a second navigator sequence for acquiring second navigator signals generated from the navigator region using the coil, and wherein the profile generating unit is configured to generate a second profile including the position information on the first portion, based on the second navigator signal received by the channel selected by the selecting unit.

8. The magnetic resonance apparatus of claim 4, wherein the scan unit is configured to execute a second navigator sequence for acquiring second navigator signals generated from the navigator region using the coil, and wherein the profile generating unit is configured to generate a second profile including the position information on the first portion, based on the second navigator signal received by the channel selected by the selecting unit.

9. The magnetic resonance apparatus of claim 5, including a unit configured to determine position information on the first portion when the second navigator sequence is executed, based on the second profile.

10. The magnetic resonance apparatus of claim 6, including a unit configured to determine position information on the first portion when the second navigator sequence is executed, based on the second profile.

11. The magnetic resonance apparatus of claim 7, including a unit configured to determine position information on the first portion when the second navigator sequence is executed, based on the second profile.

12. The magnetic resonance apparatus of claim 8, including a unit configured to determine position information on the first portion when the second navigator sequence is executed, based on the second profile.

13. The magnetic resonance apparatus of claim 9, wherein the selecting unit is configured to select two or more channels based on the correlations, wherein the profile generating unit is configured to generate second profiles including the position information on the first portion for every channel selected, based on the second navigator signals received by the two or more selected channels, and wherein the unit configured to determine the position information on the first portion is configured to add the second profiles obtained for every channel selected and to determine the position information on the first portion when the second navigator sequence is executed, based on a second profile obtained after the addition.

14. The magnetic resonance apparatus of claim 10, wherein the selecting unit is configured to select two or more channels based on the correlations, wherein the profile generating unit is configured to generate second profiles including the position information on the first portion for every channel selected, based on the second navigator signals received by the two or more selected channels, and wherein the unit configured to determine the position information on the first portion is configured to add the second profiles obtained for every channel selected and to determine the position information on the first portion when the second navigator sequence is executed, based on a second profile obtained after the addition.

15. The magnetic resonance apparatus of claim 11, wherein the selecting unit is configured to select two or more channels based on the correlations, wherein the profile generating unit is configured to generate second profiles including the position information on the first portion for every channel selected, based on the second navigator signals received by the two or more selected channels, and wherein the unit configured to determine the position information on the first portion is configured to add the second profiles obtained for every channel selected and to determine the position information on the first portion when the second navigator sequence is executed, based on a second profile obtained after the addition.

16. The magnetic resonance apparatus of claim 12, wherein the selecting unit is configured to select two or more channels based on the correlations, wherein the profile generating unit is configured to generate second profiles including the position information on the first portion for every channel selected, based on the second navigator signals received by the two or more selected channels, and wherein the unit configured to determine the position information on the first portion is configured to add the second profiles obtained for every channel selected and to determine the position information on the first portion when the second navigator sequence is executed, based on a second profile obtained after the addition.

17. The magnetic resonance apparatus of claim 9, wherein the unit configured to determine the position information on the first portion is configured to add the first profiles obtained for every channel selected and to determine the position information on the first portion when the first navigator sequence is executed, based on a first profile obtained after the addition.

18. The magnetic resonance apparatus of claim 13, wherein the unit configured to determine the position information on the first portion is configured to add the first profiles obtained for every channel selected and to determine the position information on the first portion when the first navigator sequence is executed, based on a first profile obtained after the addition.

19. The magnetic resonance apparatus of claim 1, wherein the first portion includes an edge of a liver, wherein the second portion includes a part of a lung, and wherein the position information on the first portion is position information on the edge of the liver.

20. A method for acquiring navigator signals, comprising:
executing a first navigator sequence for acquiring, using a coil having a plurality of channels, first navigator signals generated from a navigator region including a body-moving first portion and a body-moving second portion;
generating first profiles each including position information on the first portion for every channel, based on the first navigator signals received by the respective channels;
determining correlations between the first profiles and a template indicative of a profile of reference for the navigator region, based on signal values of the first profiles and a signal value of the template; and
selecting, out of the channels, each channel used to acquire the position information on the first portion, based on the correlations, wherein the signal value of the template includes a signal value of a first polarity in a region for the first portion, and includes a signal value of a second polarity opposite to the first polarity in a region for the second portion.

\* \* \* \* \*